US010160894B2

(12) United States Patent
Nishida et al.

(10) Patent No.: US 10,160,894 B2
(45) Date of Patent: Dec. 25, 2018

(54) NON-SPHERICAL SILICA SOL, PROCESS FOR PRODUCING THE SAME, AND COMPOSITION FOR POLISHING

(71) Applicant: JGC Catalysts and Chemicals Ltd., Kawasaki-shi (JP)

(72) Inventors: Hiroyasu Nishida, Kitakyushu (JP); Kazuhiro Nakayama, Kitakyushu (JP)

(73) Assignee: JGC Catalysts and Chemicals Ltd., Kawasaki-shi (JP)

( * ) Notice: Subject to any disclaimer, the term of this patent is extended or adjusted under 35 U.S.C. 154(b) by 181 days.

(21) Appl. No.: 14/947,393

(22) Filed: Nov. 20, 2015

(65) Prior Publication Data

US 2016/0186030 A1 Jun. 30, 2016

Related U.S. Application Data

(63) Continuation of application No. 13/127,634, filed as application No. PCT/JP2009/059810 on May 28, 2009, now Pat. No. 9,272,916.

(30) Foreign Application Priority Data

Nov. 7, 2008 (JP) .................................. 2008-286618

(51) Int. Cl.
  *C09K 3/14* (2006.01)
  *C01B 33/14* (2006.01)
  (Continued)

(52) U.S. Cl.
  CPC ............ *C09K 3/1463* (2013.01); *C01B 33/14* (2013.01); *C01B 33/143* (2013.01);
  (Continued)

(58) Field of Classification Search
  CPC .. C09K 3/1463; C09K 3/1445; C09K 3/1409; H01L 21/31053; C01B 33/143; C01B 33/14; C01B 33/1435
  (Continued)

(56) References Cited

U.S. PATENT DOCUMENTS 5,221,497 A   6/1993  Watanabe et al.
5,230,953 A   7/1993  Tsugeno et al.
(Continued)

FOREIGN PATENT DOCUMENTS

JP   59008614 A    1/1984
JP   01317115 A   12/1989
(Continued)

OTHER PUBLICATIONS

Derwent Abstract, week 200454, London: Derwent Publications Ltd., AN 2004-556591, Class A18, JP 2004-203638 A, (Taitemu KK), abstract, pp. 1-3.
(Continued)

*Primary Examiner* — Daniel S Metzmaier
(74) *Attorney, Agent, or Firm* — The Webb Law Firm

(57) ABSTRACT

Provided is a non-spherical silica sol containing non-spherical silica fine particles dispersed in a dispersion medium, the non-spherical silica fine particles having an average particle diameter in a range of 3 to 150 nm as measured by dynamic light scattering, a minor-diameter/major-diameter ratio in a range of 0.01 to 0.8, and a specific surface area in a range of 10 to 800 m²/g, and also having a plurality of wart-like projections on the surfaces thereof, and a process for producing the non-spherical silica sol. The non-spherical silica fine particles contained in the non-spherical silica sol have a unique structure different from the structure of ordinary non-spherical silica fine particles.

6 Claims, 3 Drawing Sheets

(51) Int. Cl.
*C01B 33/143* (2006.01)
*H01L 21/3105* (2006.01)

(52) U.S. Cl.
CPC ........ *C01B 33/1435* (2013.01); *C09K 3/1409* (2013.01); *C09K 3/1445* (2013.01); *H01L 21/31053* (2013.01)

(58) Field of Classification Search
USPC .......................................................... 516/86
See application file for complete search history.

(56) References Cited

U.S. PATENT DOCUMENTS

| | | | |
|---|---|---|---|
| 5,597,512 | A | 1/1997 | Watanabe et al. |
| 6,398,827 | B1 | 6/2002 | Ota et al. |
| 6,632,489 | B1 | 10/2003 | Watanabe et al. |
| 7,902,072 | B2 | 3/2011 | Yamashita |
| 9,272,916 | B2 * | 3/2016 | Nishida .................. C01B 33/14 |
| 2008/0086951 | A1 | 4/2008 | Wakamiya et al. |
| 2008/0131571 | A1 | 6/2008 | Nakayama et al. |
| 2009/0124172 | A1 | 5/2009 | Uchikura et al. |
| 2010/0146864 | A1 | 6/2010 | Nakayama et al. |
| 2011/0250756 | A1 | 10/2011 | Uchikura et al. |

FOREIGN PATENT DOCUMENTS

| | | | |
|---|---|---|---|
| JP | 03257010 | A | 11/1991 |
| JP | 04065314 | A | 3/1992 |
| JP | 04187512 | A | 7/1992 |
| JP | 7118008 | A | 5/1995 |
| JP | 08253624 | A | 10/1996 |
| JP | 08279480 | A | 10/1996 |
| JP | 11214338 | A | 8/1999 |
| JP | 2001011433 | A | 1/2001 |
| JP | 2001048520 | A | 2/2001 |
| JP | 2001150334 | A | 6/2001 |
| JP | 2002003212 | A | 1/2002 |
| JP | 2002038049 | A | 2/2002 |
| JP | 2003133267 | A | 5/2003 |
| JP | 3441142 | B2 | 6/2003 |
| JP | 2004035293 | A | 2/2004 |
| JP | 2004203638 | A | 7/2004 |
| JP | 2004288732 | A | 10/2004 |
| JP | 2004311652 | A | 11/2004 |
| JP | 2007145633 | A | 6/2007 |
| JP | 2007153671 | A | 6/2007 |
| JP | 2007153672 | A | 6/2007 |
| JP | 2007153692 | A | 6/2007 |
| JP | 2007153732 | A | 6/2007 |
| JP | 2007266597 | A | 10/2007 |
| JP | 2008137822 | A | 6/2008 |
| JP | 2008169099 | A | 7/2008 |
| JP | 2008169102 | A | 7/2008 |
| WO | 0015552 | A1 | 3/2000 |
| WO | 2007018069 | A1 | 2/2007 |

OTHER PUBLICATIONS

Machine Translation of Publ. No. JP 2004-203638, published Jul. 2004, Japan Patent Office, Tokyo, Japan, obtained online © http://dossier1.ipdl.inpit.go.jp/AIPN/odse_top_dn.ipdl?N0000=7400 (Downloaded Jun. 5, 2014), pp. 1-13.

Abstract, TW200801168, Jan. 1, 2008, Applicants: JSR Corp et al.

* cited by examiner

[Fig. 3]
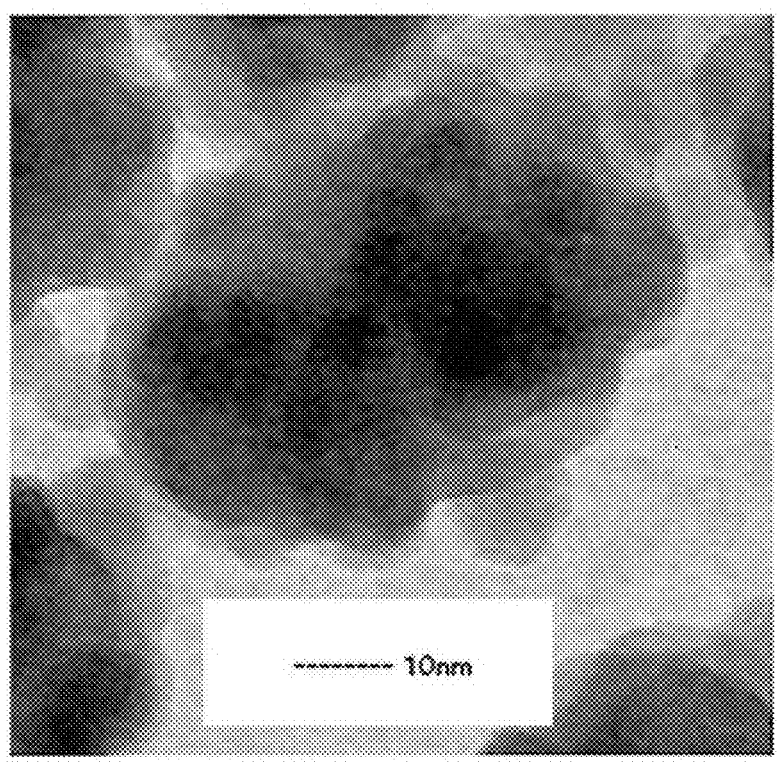

NON-SPHERICAL SILICA SOL, PROCESS FOR PRODUCING THE SAME, AND COMPOSITION FOR POLISHING

CROSS REFERENCE TO RELATED APPLICATIONS

This application is a continuation of and claims priority to U.S. patent application Ser. No. 13/127,634 filed on May 4, 2011, which is the national stage of International Patent Application No. PCT/JP2009/059810 filed on May 28, 2009, which claims priority to Japanese Patent Application No. 2008-286618 filed on Nov. 7, 2008, the entire contents of each of which is expressly incorporated by reference herein.

TECHNICAL FIELD

The present invention relates to a non-spherical silica sol containing a dispersion medium and non-spherical silica fine particles in which a plurality of wart-like projections are formed on the surfaces of silica fine particles serving as a core, the non-spherical silica fine particles being dispersed in the dispersion medium, and a process for producing the same. Also, the present invention relates to a composition for polishing, the composition containing the non-spherical silica sol.

BACKGROUND ART

In non-spherical silica sols in which non-spherical silica fine particles are dispersed in a solvent, a chain shape, a moniliform shape, and a spheroidal shape are known as the shape of the non-spherical silica fine particles. Such non-spherical silica sols are used as, for example, various polishing agents.

As a process for producing a non-spherical silica sol containing irregular-shaped particles, Japanese Unexamined Patent Application Publication No. 1-317115 (PTL 1) discloses a process for producing a non-spherical silica sol containing a liquid medium and elongated-shaped non-spherical colloidal silica particles dispersed in the liquid medium, in which a ratio $D_1/D_2$ of a particle diameter ($D_1$) measured by an image analysis method to a particle diameter ($D_2$) measured by a nitrogen gas adsorption method is 5 or more, $D_1$ is 40 to 500 millimicron, and the non-spherical colloidal silica particles each have a uniform thickness in a range of 5 to 40 millimicron measured by electron microscopy and have an extending direction only in one plane. This production process includes (a) a step of adding a predetermined amount of an aqueous solution containing a water-soluble calcium salt, a magnesium salt, or the like to a predetermined colloidal aqueous solution of activated silicic acid, and mixing the solutions, (b) a step of further adding an alkali metal oxide, a water-soluble organic base, or a water-soluble silicate thereof so that a ratio $SiO_2/M_2O$ (where M represents an atom of the alkali metal atom or a molecule of the organic base) is 20 to 200 on a molar ratio basis, and mixing the resulting mixture, and (c) a step of heating the mixture obtained in the previous step at 60° C. to 150° C. for 0.5 to 40 hours.

Japanese Patent No. 3441142 (PTL 4) proposes a polishing agent for a semiconductor wafer, the polishing agent being composed of a stable sol of silica, in which the number of colloidal silica particles having a major diameter of 7 to 1,000 nm and a minor-diameter/major-diameter ratio of 0.3 to 0.8, the major diameter and the minor diameter being determined by image analysis of an electron micrograph, accounts for 50% or more of the total number of particles.

Japanese Unexamined Patent Application Publication No. 7-118008 (PTL 5) discloses a process for producing an elongated-shaped non-spherical silica sol obtained by adding an aqueous solution of a water-soluble calcium salt, magnesium salt, or a mixture thereof to a colloidal aqueous solution of activated silicic acid, adding an alkaline substance to the resulting aqueous solution, heating a portion of the resulting mixture at 60° C. or higher to prepare a heel solution, preparing a feed solution composed of the remaining portion of the mixture, adding the feed solution to the heel solution while evaporating water during the addition so that the $SiO_2$ concentration is concentrated to 6% to 30% by weight.

Japanese Unexamined Patent Application Publication No. 8-279480 (PTL 6) discloses a colloidal silica aqueous solution in which colloidal silica particles having a particle diameter of usually 4 to 1,000 nm, and preferably 7 to 500 nm are dispersed in an aqueous medium, and which has a $SiO_2$ concentration of 0.5% to 50% by weight, and preferably 0.5% to 30% by weight. The colloidal silica aqueous solution is produced by, for example, (1) a method including neutralizing an aqueous alkali silicate solution with a mineral acid, adding an alkaline substance to the resulting solution, and aging the resulting mixture by heating, (2) a method including adding an alkaline substance to an activated silicic acid obtained by performing a cation exchange treatment of an aqueous alkali silicate solution, and aging the resulting mixture by heating, (3) a method including aging activated silicic acid by heating, the activated silicic acid being obtained by hydrolyzing an alkoxysilane such as ethyl silicate, or (4) a method including directly dispersing silica fine particles in an aqueous medium. It is described that the shape of the silica particles is a spherical shape, a distorted shape, a flat shape, a flaky shape, an elongated shape, a fibrous shape, or the like.

Japanese Unexamined Patent Application Publication No. 11-214338 (PTL 7) discloses a method for polishing a silicon wafer using a polishing material containing colloidal silica particles as a main component, the method being characterized in that colloidal silica particles having a major-diameter/minor-diameter ratio of 1.4 or more and obtained by allowing methyl silicate purified by distillation to react with water in methanol solvent using, as a catalyst, ammonia or ammonia and an ammonium salt are used.

International Publication No. WO00/15552 (PTL 8) describes a non-spherical silica sol containing spherical colloidal silica particles having an average particle diameter of 10 to 80 nm and metal-oxide-containing silica that joins the spherical colloidal silica particles to each other, in which a ratio $D_1/D_2$ of a particle diameter ($D_1$) of the spherical colloidal silica particles measured by an image analysis method to a particle diameter ($D_2$) thereof measured by a nitrogen adsorption method is 3 or more, $D_1$ is 50 to 500 nm, and moniliform colloidal silica particles in which the spherical colloidal silica particles are linked in a row only in one plane are dispersed.

International Publication No. WO00/15552 also describes a process for producing the non-spherical silica sol, the process including (a) a step of adding an aqueous solution of a water-soluble metal salt to a predetermined aqueous colloidal solution of activated silicic acid or acidic non-spherical silica sol in an amount of 1% to 10% by weight on a metal oxide basis relative to $SiO_2$ in the aqueous colloidal solution or the acidic non-spherical silica sol to prepare a mixed liquid 1 (b) a step of adding an acidic spherical silica sol having an average particle diameter of 10 to 80 nm and a pH of 2 to 6 to the mixed liquid 1 in such an amount that a ratio A/B (weight ratio) of a silica content (A) due to this acidic spherical silica sol to a silica content (B) due to this mixed liquid 1 is 5 to 100 and the total silica content (A+B) of a mixed liquid 2 obtained by mixing the acidic spherical silica sol and the mixed liquid 1 is 5% to 40% by weight on a $SiO_2$ basis in the mixed liquid 2, and (c) adding an alkali metal hydroxide, a water-soluble organic base, or a water-soluble silicate to the resulting mixed liquid 2 so that the pH becomes 7 to 11, mixing, and heating the resulting mixture.

Japanese Unexamined Patent Application Publication No. 2001-11433 (PTL 9) describes a process for producing a moniliform non-spherical silica sol. In the process, an aqueous solution containing one or more water-soluble salt of a divalent or trivalent metal is added to an aqueous colloidal solution of activated silicic acid, the aqueous colloidal solution containing 0.5% to 10% by weight of $SiO_2$ and a pH of 2 to 6 in such an amount that the content of a metal oxide (where, in the case of a salt of a divalent metal, the metal oxide is represented by MO, and in the case of a salt of trivalent metal, the metal oxide is represented by $M_2O_3$, however, M represents a divalent or trivalent metal atom and O represents an oxygen atom) is 1% to 10% by weight relative to $SiO_2$ of the aqueous colloidal solution of activated silicic acid, and the resulting aqueous solution is mixed to prepare a mixed liquid (1). To the mixed liquid (1), an acidic spherical silica sol having an average particle diameter of 10 to 120 nm and a pH of 2 to 6 is added so that a ratio A/B (weight ratio) of a silica content (A) due to this acidic spherical silica sol to a silica content (B) due to this mixed liquid (1) is 5 to 100 and the total silica content (A+B) of a mixed liquid (2) obtained by mixing this acidic spherical silica sol and the mixed liquid (1) is 5% to 40% by weight on a $SiO_2$ basis in the mixed liquid (2), and the resulting liquid is mixed. Furthermore, an alkali metal hydroxide or the like is added to the mixed liquid (2) so that the pH of the liquid becomes 7 to 11, and the resulting mixture is mixed to prepare a mixed liquid (3). The mixed liquid (3) is then heated at 100° C. to 200° C. for 0.5 to 50 hours.

Japanese Unexamined Patent Application Publication No. 2001-48520 (PTL 10) describes a process for producing a non-spherical silica sol in which elongated-shaped amorphous silica particles having an average diameter of 5 to 100 nm in a thickness direction and a length 15 to 50 times the average diameter, the average diameter and the thickness being measured by electron microscopy, are dispersed in a liquid dispersion medium. In the process, an alkyl silicate is hydrolyzed in the presence of an acid catalyst without using a solvent in a composition in which the silica concentration is in a range of 1 to 8 mol/L, the acid concentration is in a range of 0.0018 to 0.18 mol/L, and the water concentration is in a range of 2 to 30 mol/L. The reaction solution is then diluted with water so that the silica concentration is in a range of 0.2 to 15 mol/L. Subsequently, an alkali catalyst is added thereto so that the pH becomes 7 or more, and the resulting mixture is heated to carry out polymerization of silicic acid.

Japanese Unexamined Patent Application Publication No. 2001-150334 (PTL 11) describes a process for producing a non-spherical silica sol containing silica having a distorted shape. In the process, a salt of an alkaline earth metal such as Ca, Mg, or Ba is added to an acidic aqueous solution of activated silicic acid having a $SiO_2$ concentration of 2% to 6% by weight, the acidic aqueous solution being obtained by performing an cation-removing treatment of an aqueous solution of an alkali metal silicate, such as water glass, in an amount of 100 to 1,500 ppm by weight on a basis of an oxide of the alkaline earth metal relative to $SiO_2$ of the activated silicic acid. Furthermore, the same alkali substance is added in such an amount that a molar ratio $SiO_2/M_2O$ (where M represents an alkali metal atom, $NH_4$, or a quaternary ammonium group) in this liquid is 20 to 150 to prepare an initial heel solution. Similarly, an aqueous activated silicic acid solution having a $SiO_2$ concentration of 2% to 6% by weight and a molar ratio $SiO_2/M_2O$ (where M represents the same as the above) of 20 to 150 is prepared and used as a charge solution. The charge solution is added to the initial heel solution at 60° C. to 150° C. at a rate of 0.05 to 1.0 per hour on a basis of a weight ratio of charge solution $SiO_2$/ initial heel solution $SiO_2$ while removing water from the liquid by evaporation (or without removing water).

Japanese Unexamined Patent Application Publication No. 2003-133267 (PTL 12) describes, as polishing particles which suppress dishing (excessive polishing) and with which a substrate surface can be evenly polished, polishing particles characterized by containing an irregular-shaped particle group in which two or more primary particles having an average particle diameter in a range of 5 to 300 nm are bonded to each other. It is described that, in particular, polishing particles in which the number of primary particles constituting the irregular-shaped particle group in the total number of primary particles in the polishing particles is in a range of 5% to 100% are effective.

Japanese Unexamined Patent Application Publication No. 2004-288732 (PTL 13) discloses a slurry for polishing a semiconductor, the slurry being characterized by containing non-spherical colloidal silica, an oxidizing agent, an organic acid, and water as a balance. In PTL 13, a slurry in which (major diameter/minor diameter) of the non-spherical colloidal silica is 1.2 to 5.0 has been proposed. Japanese Unexamined Patent Application Publication No. 2004-311652 (PTL 14) also discloses a similar non-spherical colloidal silica.

In addition, with regard to a silica-alumina-coated chain, non-spherical silica sol, Japanese Unexamined Patent Application Publication No. 2002-3212 (PTL 15) discloses a method for producing a silica-alumina-coated chain, non-spherical silica sol including (a) a step of adding a silicic acid solution to an aqueous solution of an alkali metal silicate containing 0.05% to 5.0% by weight of $SiO_2$ so that $SiO_2/M_2O$ (molar ratio, where M represents an alkali metal or a quaternary ammonium) in the resulting mixed liquid is 30 to 60; (b) a step of adding one or more metal compounds of a divalent to tetravalent metal before, during, or after the step of adding the silicic acid solution; (c) a step of maintaining the resulting mixed liquid at any temperature of 60° C. or higher for a certain period of time; (d) a step of adding a silicic acid solution to the reaction mixture again so that $SiO_2/M_2O$ (molar ratio) in the reaction mixture is 60 to 200; and (e) a step of simultaneously adding an aqueous solution of an alkali metal silicate and an aqueous solution of an alkali aluminate to the reaction mixture on the alkali side.

As an example of silica-based fine particles having projection structures on the surfaces thereof, Japanese Unexamined Patent Application Publication No. 3-257010 (PTL 16) describes silica particles having continuous irregular projections with a size of 0.2 to 5 μm when observed with an electron microscope, the silica particles having an average particle diameter of 5 to 100 μm, a specific surface area of 20 $m^2$/g or less determined by a BET method, and a pore volume of 0.1 mL/g or less.

Japanese Unexamined Patent Application Publication No. 2002-38049 (PTL 17) describes silica-based fine particles characterized in that substantially spherical and/or hemispherical projections are formed on the entire surfaces of seed particles, and the projections are bonded to the seed particles by a chemical bond. Furthermore, PTL 17 describes a process for producing silica-based fine particles including (A) a step of hydrolyzing and condensing a specific alkoxysilane compound to produce polyorganosiloxane particles; (B) a step of surface-treating the polyorganosiloxane particles with a surface adsorbent; and (C) a step of forming projections on the entire surface of the polyorganosiloxane particles that have been surface-treated in step (B) above using the alkoxysilane compound.

Japanese Unexamined Patent Application Publication No. 2004-35293 (PTL 18) discloses silica-based particles characterized in that substantially spherical and/or hemispherical projections are formed on the entire surfaces of seed particles, the projections are bonded to the seed particles by a chemical bond, and compression moduli of the seed particles and projections under 10% compression are different from each other.

However, the particles described in Japanese Unexamined Patent Application Publication No. 3-257010 (PTL 16) include only silica particles having an average particle diameter of 5 to 100 μm. Japanese Unexamined Patent Application Publication No. 2002-38049 (PTL 17) discloses only silica-based particles having an average particle diameter substantially in a range of 0.5 to 30 μm. Similarly, Japanese Unexamined Patent Application Publication No. 2004-35293 (PTL 18) also discloses only such particles.

SUMMARY OF INVENTION

Technical Problem

It is an object of the present invention to provide a silica sol which has good properties such as a polishing property and in which non-spherical silica fine particles having a small average particle diameter are dispersed in a dispersion medium, and a process for producing the same. It is another object of the present invention to provide a composition for polishing, the composition containing the non-spherical silica sol.

Solution to Problem

The present invention that achieves the above objects provides a non-spherical silica sol characterized by containing non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.8, and a specific surface area in a range of 10 to 800 m$^2$/g, and also having a plurality of wart-like projections on the surfaces thereof.

A first preferred embodiment of the non-spherical silica sol according to the present invention is the non-spherical silica sol in which when an X-Y curve is drawn, where, in a plane containing a major axis of each of the non-spherical silica fine particles having wart-like projections, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values.

A second preferred embodiment is the non-spherical silica sol in which when, in a plane containing a major axis of each of the non-spherical silica fine particles having wart-like projections, the distance from an arbitrary point on an outer edge of the non-spherical silica fine particle to an intersection point B of a line passing through the point on the outer edge and orthogonal to the major axis and the major axis is defined as Y, the distance Y has a coefficient of variation in a range of 5% to 50%.

A third preferred embodiment is the non-spherical silica sol in which the number of the non-spherical silica fine particles having wart-like projections is 50% or more of the total number of silica fine particles serving as a dispersoid.

A fourth preferred embodiment is the non-spherical silica sol in which the non-spherical silica fine particles having wart-like projections include a [SiO$_{4/2}$] unit.

A fifth preferred embodiment is the non-spherical silica sol in which the non-spherical silica fine particles having wart-like projections are composed of polysiloxane including a [SiO$_{4/2}$] unit obtained by hydrolysis of tetraethoxysilane.

A sixth preferred embodiment is the non-spherical silica sol characterized in that the content of sodium contained in the non-spherical silica fine particles having wart-like projections is 100 mass ppm or less.

Other inventions in the present application provide a polishing material containing the non-spherical silica sol, and a composition for polishing characterized by containing the non-spherical silica sol.

Another invention in the present application provides a process for producing the non-spherical silica sol, the process being characterized by including adding 50 to 2,500 parts by mass (on a silica basis) of a liquid B to 100 parts by mass (on a silica basis) of a liquid A described below in the presence of an electrolyte composed of a salt of a strong acid (where the number of equivalents of the electrolyte is represented by (EE)) to grow non-spherical seed silica fine particles, in which the liquid B is added so that an equivalent ratio of an alkali to the electrolyte (EA/EE) is in a range of 0.4 to 8.

Liquid A: A non-spherical seed silica sol in which non-spherical seed silica fine particles having an average particle diameter in a range of 3 to 200 nm measured by dynamic light scattering and a minor-diameter/major-diameter ratio in a range of 0.01 to 0.8 are dispersed in a dispersion medium Liquid B: An aqueous alkali silicate solution (where the number of equivalents of the alkali contained in the liquid B is represented by (EA).)

A preferred embodiment of the process for producing the non-spherical silica sol is the above process for producing the non-spherical silica sol in which the liquid B and the electrolyte are each added to the liquid A in a temperature range of 40° C. to 150° C. over a period of 15 minutes to 10 hours, and aging is performed.

Another invention in the present application provides a process for producing the non-spherical silica sol, the process being characterized by including maintaining the temperature of a mixed solvent containing a water-soluble organic solvent and water in a range of 30° C. to 150° C.; simultaneously and continuously or intermittently adding 1) a water-soluble organic solvent solution of a tetrafunctional silane compound represented by general formula (1) given below and 2) an alkali catalyst solution to the mixed solvent; and after the completion of the addition, maintaining the temperature of the resulting liquid in a range of 30° C. to 150° C. so that the tetrafunctional silane compound is hydrolyzed and condensed to produce a non-spherical silica sol, in which a molar ratio of water to the tetrafunctional silane compound is in a range of 2 to 4.

[Chem. 1]

(1)

(In formula (1), R represents an alkyl group having 2 to 4 carbon atoms.) A preferred embodiment of the process for producing the non-spherical silica sol is the above process for producing the non-spherical silica sol in which the tetrafunctional silane compound is tetraethoxysilane.

Advantageous Effects of Invention

The non-spherical silica fine particles contained in the non-spherical silica sol according to the present invention have a unique structure different from the structure of ordinary non-spherical silica fine particles. Accordingly, the non-spherical silica sol according to the present invention is good in terms of physical properties such as a filling property, an oil-absorbing property, and an electrical property, and in terms of optical properties. The non-spherical silica sol according to the present invention is useful, for example, as a polishing material and a composition for polishing, and is good especially in the effect of a polishing property.

BRIEF DESCRIPTION OF THE DRAWINGS

FIG. 3 is a scanning electron micrograph (magnification: 250,000 times) of a non-spherical silica sol prepared in Example 3.

DESCRIPTION OF THE INVENTION

[Non-Spherical Silica Sol]

A non-spherical silica sol of the present invention is characterized by containing non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.8, and a specific surface area in a range of 10 to 800 m²/g, and also having a plurality of wart-like projections on the surfaces thereof.

The non-spherical silica fine particles serving as a dispersoid of the non-spherical silica sol according to the present invention preferably have a minor-diameter/major-diameter ratio in a range of 0.01 to 0.8. When the minor-diameter/major-diameter ratio is within this range, the silica fine particles have a shape considered to be an irregular shape such as a fibrous shape, a columnar shape, or a spheroidal shape, that is, a shape that is not considered to be a spherical shape. When the minor-diameter/major-diameter ratio exceeds 0.8, the particles substantially have a spherical shape. When the minor-diameter/major-diameter ratio is less than 0.01, the production of the particles may not be easy. The minor-diameter/major-diameter ratio is more preferably in a range of 0.1 to 0.7, and still more preferably in a range of 0.12 to 0.65.

The structure of the non-spherical silica sol according to the present invention differs from that of non-spherical silica sols including non-spherical silica sols in the related art in that the non-spherical silica fine particles serving as a dispersoid of the silica sol have a plurality of wart-like projections on the surfaces thereof. That is, the non-spherical silica fine particles contained in the non-spherical silica sol according to the present invention can be referred to as non-spherical bumpy-surface-candy-ball-shaped silica fine particles or wart-like projection-coated non-spherical silica fine particles. The non-spherical silica sol according to the present invention can exhibit unique advantages in various applications such as a polishing application, a filler of a resin or a component for forming a coating film, and a filler of an ink-absorbing layer because of the presence of the wart-like projections. The wart-like projection can be confirmed in an electron micrograph of the non-spherical silica sol and have a structure projecting or inflating from peripheral portions of the surfaces of the particles.

The non-spherical silica fine particles according to the present invention may be prepared by using water glass or the like as a raw material, or prepared by using an alkoxysilane as a raw material, as described below. An example of the latter case is a non-spherical silica sol characterized in that the non-spherical silica fine particles include a [SiO$_{4/2}$] unit. A process for producing such a non-spherical silica sol will be described below.

Figure 1:
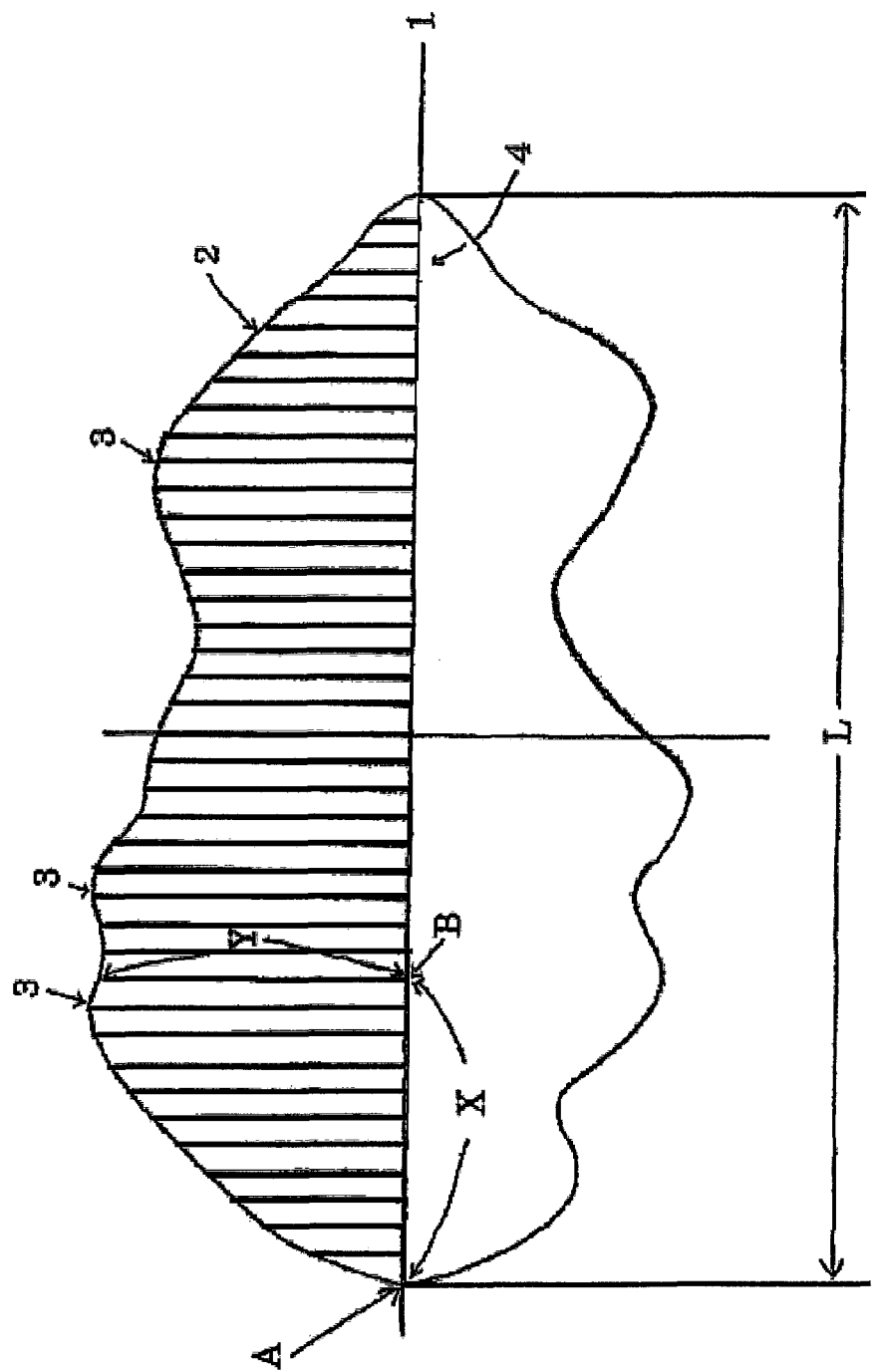
FIG. 1 is a schematic view showing how to determine the number of local maximum values.

With regard to the non-spherical silica fine particles, preferably, when an X-Y curve is drawn, where, in a plane containing a major axis of each of the non-spherical silica fine particles, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values. Specifically, in a scanning electron microscopy image (250,000 to 500,000 times) of a non-spherical silica fine particle, the major axis of the non-spherical silica fine particle is determined, and the entire length of the major axis is equally divided into 40 portions. The distance between each point (point B) after the division and an intersection point of a line passing through the point and orthogonal to the major axis, the line extending to one side of the fine particle, and the outer edge of the fine particle is recorded as Y. In addition, the distance from one intersection point (point A) out of two intersection points of the outer edge of the non-spherical silica fine particle and the major axis to each point (point B) after the division is defined as X. Y is taken as the vertical axis, and X is taken as the horizontal axis. The values of Y corresponding to the values of X are plotted, thereby drawing the X-Y curve. The number of local maximum values of this X-Y curve can be determined. In the present invention, this measurement is performed for 50 non-spherical silica fine particles, and non-spherical silica fine particles in which the average of the number of local maximum values is 2 or more are treated as the particles having a plurality of local maximum values. FIG. 1 shows the outline of how to determine the number of local maximum values. In FIG. 1, "1" indicates a major axis, "2" indicates an outer edge, "3" indicates a position of a local maximum value, "4" indicates lines that equally divide the total length into 40 portions, and "L" indicates a length in the major axis direction.

The number of local maximum values is preferably in a range of 2 to 10, and more preferably in a range of 3 to 8.

The number of local maximum values may be determined by measurement with an analytical instrument.

With regard to the non-spherical silica fine particles, more preferably, when, in a plane containing a major axis of each of the fine particles, the distance from an arbitrary point on an outer edge of the non-spherical silica fine particle to an intersection point B of a line passing through the point on the outer edge and orthogonal to the major axis and the major axis is defined as Y, the distance Y has a coefficient of variation in a range of 5% to 50%. With regard to the measurement of the coefficient of variation of the distance Y from the outer edge to the major axis of the fine particle in the present invention, the coefficient of variation was calculated by the following method.

1) A distance (major axis radius M) from the center point of the major axis (located at a position at which the major axis of a fine particle is divided in half) to one outer edge of the fine particle on the major axis is measured. Points of 0% to 50% are plotted on the major axis from the center point at intervals of 5% of the length of the major axis radius M.

2) On each of the plotted points, a line orthogonal to the major axis is drawn. A distance Y from a point at which this line intersects with the outer edge of the fine particle on one side to each plotted point is measured.

3) With regard to the coefficient of variation (CV value) with respect to the distance Y from the outer edge to the major axis of the fine particle, the coefficients of variation (CV values) of the distance Y are calculated on the major axis in a range from the center point, i.e., 0%, to 10% of the major axis radius M, and similarly in a ranges of 0% to 20%, 0% to 30%, 0% to 40%, and 0% to 50% of the major axis radius M. Thus, five coefficients of variation (CV values) are determined Among these coefficients of variation, the maximum coefficient of variation (CV value) is defined as the coefficient of variation (CV value) with respect to the distance Y in the particle.

Figure 2:
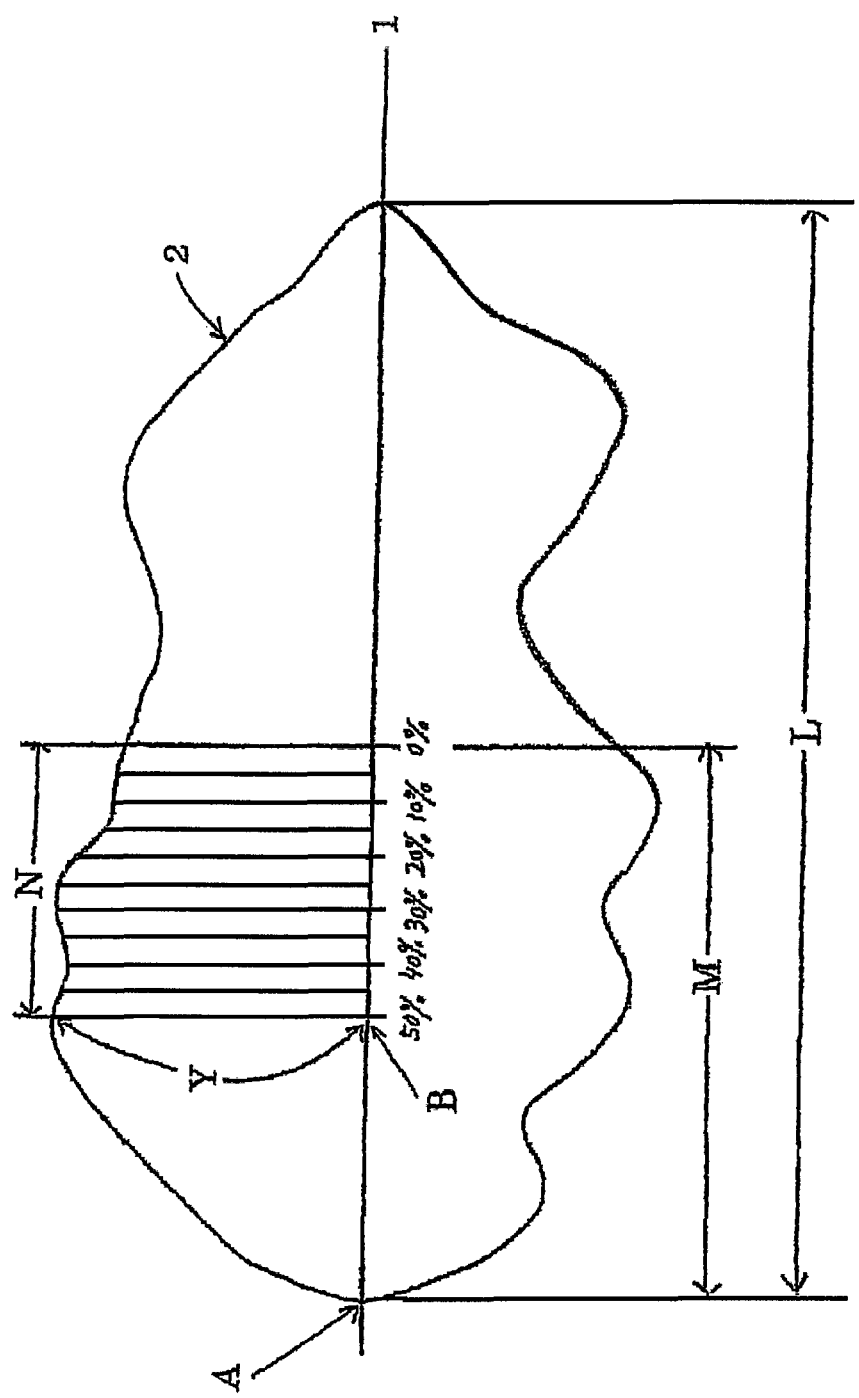
FIG. 2 is a schematic view showing how to determine a coefficient of variation of a distance Y.

4) The measurements described in 1) to 3) are performed for 50 particles, and the average of the results is determined as the coefficient of variation (CV value) with respect to the distance Y in non-spherical silica fine particles. FIG. 2 shows the outline of how to determine the coefficient of variation of the distance Y. In FIG. 2, "1" and "2", and "L" indicate the same as those in FIG. 1, "M" indicates a length of the radius in the major axis direction, and "N" indicates a length of 50% of M.

Note that the coefficient of variation (CV value) of the distance Y can be determined from a relational expression:

Coefficient of variation(CV value)[%]=(standard deviation($\sigma$) of distance $Y$/average($Ya$) of distance $Y$)×100

As described above, when an X-Y curve is drawn, where, in a plane containing a major axis of each of the non-spherical silica fine particles, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values. In this case, the non-spherical silica fine particle has wart-like projections. In such a non-spherical silica fine particle, when the coefficient of variation (CV value) with respect to the distance Y from the outer edge to the major axis is in a range of 5% to 50%, it is shown that there is a significant variation in the length of the distance Y from the outer edge to the major axis of the particle, and that the surface of the non-spherical silica fine particle has undulations.

When the average number of local maximum values is 2 or more, and the coefficient of variation (CV value) with respect to the distance Y from the outer edge to the major axis is less than 5%, the surface of the non-spherical silica fine particle may have undulations but the undulations are very small, or the surfaces of the non-spherical silica fine particle may not have substantially undulations. When the coefficient of variation (CV value) with respect to the distance Y from the outer edge to the major axis exceeds 50%, it is not easy to prepare such particles. In addition, such particles may have a problem of the toughness in terms of structure.

The coefficient of variation (CV value) with respect to the distance Y from the outer edge to the major axis is more preferably in a range of 7% to 45%, and still more preferably in a range of 10% to 40%.

The non-spherical silica fine particles serving as a dispersoid of the non-spherical silica sol according to the present invention preferably have an average particle diameter in a range of 3 to 200 nm as measured by dynamic light scattering. When the average particle diameter is within this range, for example, in each of the above-mentioned applications, it is easy to achieve effective advantages based on the shape of the non-spherical silica sol according to the present invention. When the average particle diameter exceeds 200 nm, in general, a build-up step excessively proceeds, and thus a tendency that the wart-like projections are flattened increases, though it depends on the size of fine particles used as a raw material. When the average particle diameter is less than 3 nm, it is not easy to prepare non-spherical silica fine particles used as a raw material. The average particle diameter of the non-spherical silica fine particles, the average particle diameter being measured by dynamic light scattering, is preferably in a range of 10 to 195 nm, and more preferably in a range of 20 to 195 nm.

With regard to the non-spherical silica fine particles having an average particle diameter in a range of 3 to 200 nm as measured by dynamic light scattering, non-spherical silica fine particles having an average diameter of the major axis in a range of 3 to 190 nm as measured by an image analysis method correspond to the particles. Here, "major axis" means the maximum diameter of each of the non-spherical silica fine particles. Furthermore, in the present application, "major axis measured by an image analysis method" means the maximum diameter of a particle measured using a scanning electron micrograph (magnification: 250,000 to 500,000 times). A specific measuring method will be described in Examples. The above average of the major axis is preferably in a range of 10 to 180 nm, and more preferably in a range of 15 to 170 nm.

The non-spherical silica fine particles have a specific surface area in a range of 10 to 800 $m^2/g$, preferably in a range of 20 to 500 $m^2/g$, and more preferably in a range of 30 to 300 $m^2/g$. A specific surface area smaller than 10 $m^2/g$ is not preferable because the particles include non-spherical silica fine particles in which wart-like projections are hardly formed on the surfaces thereof. Also, it is not easy to prepare particles having a specific surface area larger than 800 $m^2/g$ as the non-spherical silica fine particles according to the present invention. The specific surface area is a numerical value determined by a BET method (nitrogen adsorption method).

A solvent in which the non-spherical silica fine particles are dispersed may be any of water, an organic solvent, and a mixed solvent of these. Examples of such a solvent include water-soluble organic solvents such as alcohols, e.g., methyl alcohol, ethyl alcohol, and isopropyl alcohol; ethers; esters; and ketones.

The non-spherical silica sol according to the present invention includes silica fine particles dispersed as a dispersoid in a dispersion medium, the silica fine particles containing the above-described non-spherical silica fine particles having a plurality of wart-like projections on the surfaces thereof. However, all the silica fine particles serving as the dispersoid need not be the non-spherical silica fine particles having a plurality of wart-like projections on the surfaces thereof. A ratio of the number of non-spherical silica fine particles having a plurality of wart-like projections on the surfaces thereof to the total number of the silica fine particles serving as the dispersoid is preferably as high as possible. The ratio is preferably 50% or more, and more preferably 60% or more. The higher the ratio, the easier a practical polishing rate can be obtained when the non-spherical silica sol is used in the application of polishing.

The silica concentration of the non-spherical silica sol according to the present invention is preferably in a range of 1% to 50% by mass, and more preferably in a range of 5% to 30% by mass.

A process for producing a non-spherical silica sol according to the present invention is not necessarily limited. However, the non-spherical silica sol is usually prepared by a first process or a second process for producing a non-spherical silica sol described below.

The first process for producing a non-spherical silica sol includes a case where a commercially available non-spherical silica sol is used as a raw material, in particular, a case where a non-spherical silica sol prepared using water glass as a raw material is used. In this case, the non-spherical silica sol according to the present invention can be prepared at a low cost. However, sodium due to, for example, water glass used as the raw material may remain in non-spherical silica fine particles at a relatively high concentration. When such non-spherical silica sol according to the present invention is applied to a polishing material of an electronic material or a semiconductor material, contamination due to sodium may be caused.

On the other hand, in the second process for producing a non-spherical silica sol, a tetrafunctional silane compound is used as a raw material. Therefore, there is no concern that sodium is mixed in non-spherical silica fine particles. In this case, the content of sodium in the non-spherical silica fine particles can be controlled to be 100 mass ppm or less. Thus, the non-spherical silica sol can be suitably used as a polishing material of an electronic material or a semiconductor material.

Non-spherical silica fine particles prepared by the second process for producing a non-spherical silica sol are obtained by hydrolysis of a tetrafunctional silane compound such as tetraethoxysilane, and have a polysiloxane structure including a [$SiO_{4/2}$] unit.

[First Process for Producing Non-Spherical Silica Sol]
In the first process for producing a non-spherical silica sol according to the present invention, an aqueous alkali silicate solution (hereinafter, this aqueous alkali silicate solution is referred to as "liquid B") is added to a non-spherical seed silica sol (hereinafter referred to as "liquid A") in which non-spherical seed silica fine particles are dispersed in a dispersion medium in the presence of an electrolyte composed of a salt of a strong acid to grow core particles. In this process, 50 to 2,500 parts by mass of silica in the liquid B is added to 100 parts by mass of silica in the liquid A so that a ratio (EA/EE) of the number of equivalents of an alkali contained in the liquid B (EA) to the number of equivalents of the electrolyte (EE) is in a range of 0.4 to 8. Herein "non-spherical seed silica fine particles" refers to, among non-spherical silica fine particles, silica fine particles used for producing the non-spherical silica fine particles having wart-like projections according to the present invention by growing silica on the surfaces of the particles.

The process for producing a non-spherical silica sol of the present invention will now be specifically described.
Non-Spherical Seed Silica Sol (Liquid A)
As the liquid A, a non-spherical silica sol is used in which non-spherical silica fine particles having an average particle diameter in a range of 3 to 200 nm as measured by dynamic light scattering, a minor-diameter/major-diameter ratio in a range of 0.01 to 0.8, and a specific surface area in a range of 15 to 800 $m^2/g$ are dispersed in a dispersion medium.

In the process for producing a non-spherical silica sol of the present invention, a process for producing a non-spherical seed silica sol used as a raw material is not particularly limited, and a commercially available non-spherical silica sol or a known non-spherical silica sol can be used. A known non-spherical silica sol can be obtained by, for example, production processes (I) to (V) below.

(I) A process for producing an anisotropic-shaped silica sol characterized by adding a silicic acid solution to an aqueous solution of a water-soluble silicate to prepare a mixed liquid having a ratio $SiO_2/M_2O$ [where M is selected from an alkali metal, a tertiary ammonium, a quaternary ammonium, or guanidine] (molar ratio) in a range of 30 to 65; intermittently or continuously adding a silicic acid solution again to the mixed liquid at a temperature of 60° C. to 200° C. to prepare a silica sol; and heating the silica sol at a pH in a range of 7 to 9 at 60° C. to 98° C. (refer to Japanese Unexamined Patent Application Publication No. 2007-153671).

(II) A process for producing an anisotropic-shaped silica sol characterized by adding a poly-metal salt compound to a silica sol in which silica particles having an average particle diameter in a range of 3 to 25 nm are dispersed and which has a pH in a range of 2 to 8 in an amount of 0.01 to 70 parts by weight relative to 100 parts by weight of the silica solid content of the silica sol; and heating the resulting mixture at 50° C. to 160° C. (refer to Japanese Unexamined Patent Application Publication No. 2007-153672).

(III) A process for producing an anisotropic-shaped silica sol characterized by performing a cation-removing treatment of a silica sol having an average particle diameter in a range of 3 to 20 nm to adjust the pH to be in a range of 2 to 5; performing an anion-removing treatment; adding an alkaline aqueous solution to adjust the pH to be 7 to 9; and heating the resulting mixture at 60° C. to 250° C. (refer to Japanese Unexamined Patent Application Publication No. 2007-145633).

(IV) A process for producing an anisotropic-shaped silica sol characterized by adding an alkaline aqueous solution to a silicic acid solution (a) to adjust the pH to be 10.0 to 12.0; and continuously or intermittently adding a mixture of a silicic acid solution (b) and a divalent or higher-valent water-soluble metal salt under a temperature condition of 60° C. to 150° C. (refer to Japanese Unexamined Patent Application Publication No. 2007-153692).

(V) A process for producing an anisotropic-shaped silica sol including the following steps (1) and (2) (refer to International Publication No. WO2007/018069):
(1) A step of obtaining a silica sol by removing salts by washing a silica hydrogel obtained by neutralizing a silicate with an acid, adding an alkali so that the molar ratio of $SiO_2/M_2O$ (M:Na, K, or $NH_3$) is 30 to 500, and then heating the resulting mixture in a range of 60° C. 200° C.

(2) A step of continuously or intermittently adding a silicic acid solution to the silica sol serving as a seed sol under the conditions of a pH of 9 to 12.5 and a temperature of 60° C. to 200° C. with an optional addition of an alkali.

In the process according to the present invention, the concentration of the silica solid content is preferably adjusted to be 2% to 40% by diluting such a raw material non-spherical silica sol with pure water as required.

The non-spherical seed silica sol used as the liquid A is a silica sol that includes non-spherical silica fine particles serving as a dispersoid, having a minor-diameter/major-diameter ratio in a range of 0.01 to 0.8, and having an average particle diameter smaller than or equal to the average particle diameter of non-spherical silica fine particles serving as a dispersoid of the non-spherical silica sol to be finally obtained. The minor-diameter/major-diameter ratio is more preferably in a range of 0.1 to 0.7, and still more preferably in a range of 0.12 to 0.65.

The non-spherical seed silica fine particles serving as the dispersoid of the non-spherical seed silica sol have an average particle diameter preferably in a range of 3 to 200 nm, more preferably in a range of 5 to 150 nm, and still more preferably in a range of 10 to 120 nm as measured by dynamic light scattering.

Furthermore, the non-spherical seed silica fine particles preferably have a specific surface area in a range of 5 to 800 $m^2/g$, for example.

The concentration of the non-spherical seed silica sol is preferably 0.005% to 10% by mass, and more preferably 0.01% to 5% by mass on a silica basis, though the concentration is different depending on the particle diameters of the non-spherical seed silica fine particles. When the silica concentration is less than 0.005% by mass, the amount of non-spherical seed silica fine particles serving as core particles is too small, and thus it is necessary to reduce the supply rate of the aqueous alkali silicate solution (liquid B) and/or the electrolyte. Unless the supply rate is reduced, new fine particles are generated and function as core particles. Consequently, the particle size distribution of the resulting sol may be broadened, which is inefficient in terms of preparation of a non-spherical silica sol. When the concentration of the non-spherical seed silica sol exceeds 10% by mass, the concentration is too high, and thus core particles may aggregate with each other when the aqueous alkali silicate solution and/or the electrolyte is supplied. Also in this case, the particle size distribution may be broadened and particles adhering to each other tend to be generated, which is not preferable in terms of preparation of a non-spherical silica sol.

The pH of the non-spherical seed silica sol is preferably in a range of 8 to 12, and particularly preferably in a range of 9.5 to 11.5. When the pH is less than 8, the reactivity of the surfaces of the core particles is low, and thus the rate at which the alkali silicate (liquid B) supplied is deposited on the surfaces is low. Consequently, unreacted alkali silicate may increase, new fine particles may be generated and function as core particles, whereby the particle size distribution of the resulting sol may be broadened, or aggregated particles may be produced, which is not desirable in terms of efficient production of a non-spherical silica sol. When the pH exceeds 12, the solubility of silica increases, and thus the rate of deposition of silica decreases. Consequently, the particle growth rate tends to decrease.

The pH of the non-spherical seed silica sol can be adjusted by adding an alkali Specifically, an alkali metal hydroxide such as NaOH or KOH, aqueous ammonia, quaternary ammonium hydroxide, an amine compound, or the like can be used. The temperature during the preparation of the above non-spherical seed silica sol is not particularly limited, and is usually in a range of 10° C. to 30° C.

Aqueous Alkali Silicate Solution (Liquid B)

In the present invention, an electrolyte and the aqueous alkali silicate solution (liquid B) are added to the liquid A to perform particle growth of silica fine particles. Some of or all of the electrolyte may be added to the liquid A in advance. Alternatively, the electrolyte may be continuously or intermittently added together with the aqueous alkali silicate solution of the liquid B respectively.

Examples of the alkali silicate used as the liquid B include silicic acid alkali salts of LiOH, NaOH, KOH, RbOH, CsOH, $NH_4OH$, quaternary ammonium hydride, or the like. Among these, sodium silicate (water glass), potassium silicate, or the like can be suitably used. In addition, for example, an aqueous alkali silicate solution obtained by hydrolyzing a hydrolysable organic compound such as tetraethyl orthosilicate (TEOS) in the presence of excessive NaOH or the like is also preferable.

The temperature of the non-spherical seed silica sol during the addition of the aqueous alkali silicate solution of the liquid B is preferably in a range of 40° C. to 150° C., and more preferably in a range of 60° C. to 100° C. When the temperature is lower than 40° C., the rate of reaction of silicic acid is low. Consequently, the amount of unreacted silicic acid may increase or particles having a desired size may not be obtained. When the temperature of the non-spherical seed silica sol exceeds 150° C., the operating pressure becomes too high, resulting in problems of an increase in the cost of an apparatus, a decrease in the production capacity, and a decrease in the economical efficiency. In addition, when the temperature exceeds 150° C., the effects of increasing the rate of reaction and the rate of particle growth are also small for practical purposes.

Usually, the amount of aqueous alkali silicate solution of the liquid B added (on a silica basis) is preferably in a range of 50 to 2,500 parts by mass relative to 100 parts by mass of silica contained in the liquid A, though the amount depends on the temperature and the reaction time during the growth of the core particles. When the amount is less than 50 parts by mass, the progress of the particle growth itself is low, and thus it is not easy to efficiently obtain a non-spherical silica sol having a necessary surface roughness. When the amount exceeds 2,500 parts by mass, the growth of the core particles excessively proceeds, resulting in an increase in a tendency in which silica fine particles having flat surfaces are produced. The amount of liquid B added (on a silica basis) is more preferably in a range of 80 to 1,800 parts by mass.

Electrolyte

As the electrolyte used in the present invention, a water-soluble salt composed of a known acid and base can be used. In particular, an electrolyte composed of a salt of a strong acid is preferable because such an electrolyte can accept an alkali of an alkali silicate, and, at this time, produces silicic acid used in the particle growth of core particles. Examples of the water-soluble electrolyte composed of a salt of a strong acid include sodium salts, potassium salts, lithium salts, rubidium salts, cesium salts, ammonium salts, calcium salts, and magnesium salts of a strong acid such as sulfuric acid, nitric acid, or hydrochloric acid. Alums, which are double salts of sulfuric acid, e.g., potassium alum and ammonium alum are also preferable.

The amount of electrolyte is preferably determined so that a ratio (EA/EE) of the number of equivalents of an alkali contained in the liquid B (EA) to the number of equivalents of the electrolyte (EE) is in a range of 0.4 to 8, and in particular, 0.4 to 5. When the ratio (EA/EE) is less than 0.4, the concentration of the electrolyte salt in the dispersion liquid is too high, and particles may aggregate. When the ratio (EA/EE) exceeds 8, the amount of electrolyte is small, and thus the growth rate of particles is insufficient. This is not different from an existing method in which the particle growth of core particles is performed by supplying an acidic silicic acid solution. In addition, when the ratio (EA/EE) exceeds 8, the above-described generation of silicic acid used in the particle growth of core particles, the generation being caused when the electrolyte accepts an alkali of an alkali silicate, is suppressed, and particles having a desired particle diameter may not be obtained.

The concentration of the electrolyte in the dispersion liquid is preferably in a range of 0.05% to 10% by mass. More preferably, a range of 0.1% to 5% by mass is recommended. Some of or all of the electrolyte may be added separately from the aqueous alkali silicate solution (liquid B). Alternatively, the electrolyte may be continuously or intermittently added together with the aqueous alkali silicate solution (liquid B) respectively. Also in this case, the amount of electrolyte and the amount of alkali silicate preferably satisfy the above-described relationship of the ratio of the numbers of equivalents.

The concentration of $SiO_2$ in the liquid B, which is added to the liquid A, is adjusted to be preferably in a range of 0.5% to 10% by mass, and more preferably 1% to 7% by mass by diluting the liquid B with water or concentrating the liquid B. When the $SiO_2$ concentration is less than 0.5% by mass, the concentration is too low, and thus the production efficiency is low. In addition, concentration of the resulting liquid may be necessary when the liquid is used as a product. On the other hand, when the $SiO_2$ concentration exceeds 10% by mass, aggregation of silica particles tends to occur. Accordingly, it may be impossible to obtain a sol in which silica particles having a uniform particle diameter are monodispersed. Also in the case where an electrolyte or an electrolyte and water are added to the liquid B and the resulting mixture is then added to the liquid A, the concentration of $SiO_2$ in the system is recommended to be within the above range.

During the growth of the core particles with a supply of the liquid B to the liquid A, the pH of the dispersion liquid may be maintained in a range of 8 to 13, and preferably 10 to 12 while adding an alkali or an acid, as required. As the alkali added, sodium hydroxide, potassium hydroxide, lithium hydroxide, aqueous ammonia, or an amine such as triethylamine or triethanolamine can be used. As the acid, hydrochloric acid, nitric acid, sulfuric acid, or an organic acid such as acetic acid can be used.

As described above, by adding the liquid B to the liquid A in the presence of an electrolyte composed of a salt of a strong acid to grow non-spherical seed silica fine particles, it is possible to obtain non-spherical silica fine particles having a plurality of wart-like projections on the surfaces thereof.

It is believed that silica derived from the liquid B is deposited on the surfaces of core particles or deposited in the system as fine silica particles. These silica deposits have a difference in potential from the relatively large core particles, and have a high reactivity with the core particles. This is believed to be a factor that forms sufficient undulations on the surfaces of the core particles to generate wart-like projections.

In the case where the amounts of electrolyte and alkali silicate used relative to the amount of core particles are within the range of the equivalent ratio specified in the present invention, aggregation due to the electrolyte tends to occurs with an increase in the silica concentration and a decrease in the particle diameter. Therefore, the particle growth is preferably performed at a low concentration.

When the liquid B and the electrolyte are added to the liquid A, it is preferable to respectively add the liquid B and the electrolyte in a temperature range of 40° C. to 150° C. over a period of 15 minutes to 10 hours. Addition under such a condition is preferable in terms of stability of the particles.

Aging and Deionization

After the addition of the liquid B, the resulting mixture is aged as required. The aging temperature is in a range of 40° C. to 150° C., and preferably in a range of 60° C. to 100° C. The aging time is about 30 minutes to 5 hours, though the aging time is different depending on the aging temperature. By performing such aging, it is possible to obtain a silica sol in which the particle diameter is more uniform and which is good in terms of stability.

As required, the temperature of the dispersion liquid is cooled to about 40° C. or lower, and ions in the dispersion liquid may then be removed. A known method can be used as a method for removing ions in a dispersion liquid. Examples thereof include an ultrafiltration membrane method, an ion-exchange resin method, and an ion-exchange membrane method. The deionization is performed so that the amount of remaining anion is preferably 0.01% by mass or less, and more preferably 0.005% by mass of $SiO_2$. When the amount of remaining ion is 0.01% by mass or less, a silica sol having a sufficient stability can be obtained and no adverse effect of impurities is observed in a large number of applications, though these depend on the concentration described below.

The prepared silica sol is concentrated, as required. An ultrafiltration membrane method, a distillation method, a combination of these methods, or the like is usually used as the concentration method. The concentration of the silica sol after the concentration is in a range of about 1% to 50% by mass on a $SiO_2$ basis. The silica sol is diluted or further concentrated as required when being used.

[Second Process for Producing Non-Spherical Silica Sol]

As a process for producing a non-spherical silica sol prepared by using an alkoxysilane as a raw material, the following production process is preferably employed. Specifically, the temperature of a mixed solvent containing a water-soluble organic solvent and water is maintained in a range of 30° C. to 150° C.; 1) a water-soluble organic solvent solution of a tetrafunctional silane compound represented by general formula (1) given below and 2) an alkali catalyst solution are simultaneously and continuously or intermittently added to the mixed solvent; and after the completion of the addition, the temperature of the resulting liquid obtained by adding 1) and 2) above to the mixed solvent is maintained in a range of 30° C. to 150° C. to perform aging so that the tetrafunctional silane compound is hydrolyzed and condensed to produce a silica sol. In this process, a molar ratio of water to the tetrafunctional silane compound is controlled to be in a range of 2 to 4 in conducting the hydrolysis and condensation. According to this production process, it is possible to produce a non-spherical silica sol in which non-spherical silica fine particles having a plurality of wart-like projections on the surfaces thereof and composed of a $[SiO_{4/2}]$ unit are dispersed in a dispersion medium.

[Chem. 2]

$$(\text{Ro})_4\text{Si} \qquad (1)$$

(In formula (1), R represents an alkyl group having 2 to 4 carbon atoms.)

In particular, in order to produce non-spherical silica fine particles, it is necessary to hydrolyze and condense the tetrafunctional silane compound in the mixed solvent containing the water-soluble organic solvent and water in a temperature range of 30° C. to 150° C. in the presence of water in a molar ratio of 2 or more and 4 or less relative to the tetrafunctional silane compound.

In the second production process, it is believed that since a difference in the rate of reaction is caused among four alkoxy groups of the tetrafunctional silane compound under the above conditions, non-spherical silica fine particles (primary particles) having a distorted shape are formed in the initial stage of the hydrolysis and condensation and such distorted primary particles are secondarily aggregated, and consequently, the silica fine particles having wart-like projections on the surfaces thereof are produced.

When the molar ratio of water to the tetrafunctional silane compound is less than 2, the amount of water is smaller than the amount of moles with which four alkoxy groups of the tetrafunctional silane compound are completely hydrolyzed. Consequently, the reaction does not sufficiently proceed, and aggregation or precipitation tends to occur during the reaction. When the molar ratio of water to the tetrafunctional silane compound is more than 4, a sufficient difference in the rate of reaction is not generated among the alkoxy groups because the amount of water is excessive. Consequently, spherical silica fine particles that do not have sufficient undulations on the surfaces thereof tend to be produced. With regard to the range of the molar ratio of water to the tetrafunctional silane compound, a range of 2.0 to 3.8 is preferably recommended. More preferably, a range of 2.0 to 3.6 is recommended.

[Tetrafunctional Silane Compound]

The tetrafunctional silane compound used in the production process according to the present invention means an alkoxysilane compound represented by general formula (1) given below:

[Chem. 3]

$$(\text{RO})_4\text{Si} \qquad (1)$$

(In formula (1), R represents an alkyl group having 2 to 4 carbon atoms.)

Specifically, examples of the tetrafunctional silane compound include tetraethoxysilane, tetrapropoxysilane, and tetrabutoxysilane. In the cases of alkoxysilanes having 5 or more carbon atoms, a practical rate of hydrolysis may not be achieved because of the steric hindrance of alkoxy groups. In the case of tetramethoxysilane, the rate of hydrolysis reaction is higher than that in the case of tetraethoxysilane. Accordingly, the use of tetramethoxysilane is not desirable from the standpoint of synthesizing silica in a practical manner. From a practical standpoint, the use of tetraethoxysilane is recommended.

In the production process according to the present invention, usually, the tetrafunctional silane compound is preferably dissolved in a water-soluble organic solvent and used. By using the tetrafunctional silane compound after being dissolved in a water-soluble organic solvent, the influence of moisture in the atmosphere can be reduced. Examples of the water-soluble organic solvent that dissolves the tetrafunctional silane compound include the same solvents as water-soluble organic solvents described below. Specifically, a solution in which the concentration of the tetrafunctional silane compound in the water-soluble organic solvent solution of the tetrafunctional silane compound is 5% to 90% by mass is preferably used. When the concentration is less than 5% by mass, the silica concentration in the reaction mixture is low, which is not suitable for practical use. When the concentration exceeds 90% by mass, the silica concentration in the reaction mixture is too high, and aggregation or precipitation of silica tends to occur, though it depends on the reaction conditions. With regard to the concentration of the tetrafunctional silane compound, a range of 10% to 60% by mass is preferably recommended. More preferably, a range of 20% to 40% by mass is recommended.

As the water-soluble organic solvent solution of the tetrafunctional silane compound, the use of an ethanol solution of tetraethoxysilane is recommended.

[Water-Soluble Organic Solvent]

Water-soluble organic solvents used in the production process according to the present invention include organic solvents that dissolve the tetrafunctional silane compound represented by general formula (1) above and that exhibit water solubility. Examples of such a water-soluble organic solvent include ethanol, isopropyl alcohol, and tert-butanol. With regard to the selection of the water-soluble organic solvent, water-soluble organic solvents that are good in terms of compatibility with the tetrafunctional silane compound used are preferably used.

[Mixed Solvent Containing Water-Soluble Organic Solvent and Water]

With regard to the amount of water contained in a mixed solvent containing a water-soluble organic solvent and water, when the alkali catalyst solution does not contain water, it is necessary that the molar ratio of water to the tetrafunctional silane compound be within the above range. On the other hand, when the alkali catalyst solution contains water, it is necessary that the total of the amount of water contained in the mixed solvent and the amount of water contained in the alkali catalyst solution be within the above range of the molar ratio of water to the tetrafunctional silane compound.

A mixed solvent that satisfies this condition is used as the mixed solvent described above. Preferably, a mixed solvent having a concentration of the water-soluble organic solvent in a range of 30% to 95% by mass (having a concentration of water in a range of 5% to 70% by mass) is used. When the proportion of the water-soluble organic solvent is less than 30% by mass (the proportion of water is 70% by mass or more), the tetrafunctional silane compound added is not readily mixed with the mixed solvent and gelation of the tetrafunctional silane compound may occur, though it depends on the amount of tetrafunctional silane compound and the rate of hydrolysis. When the proportion of the water-soluble organic solvent exceeds 95% by mass (the proportion of water is less than 5% by mass), the amount of water used in the hydrolysis may be too small. With regard to the proportion of the water-soluble organic solvent in the mixed solvent containing the water-soluble organic solvent and water, preferably, a range of 40% to 80% by mass is recommended. More preferably, a range of 50% to 70% by mass is recommended.

[Alkali Catalyst]

As an alkali catalyst used in the production process according to the present invention, a compound that exhibits basicity, such as ammonia, an amine, an alkali metal hydride, a quaternary ammonium compound, or an amine coupling agent is used. Although an alkali metal hydride may also be used as the catalyst, such an alkali metal hydride accelerates hydrolysis of alkoxy groups of the alkoxysilane, and therefore, alkoxy groups (carbon) remaining in the prepared particles decrease and the particles become harder. Consequently, although the polishing rate is high, scratches may be generated. Furthermore, in the case where sodium hydride is used, a problem of an increase in the Na content occurs.

The amount of alkali catalyst used is not limited as long as a desired rate of hydrolysis is achieved. Usually, the alkali catalyst is preferably added in an amount in a range of 0.005 to 1 mole per mole of the tetrafunctional silane compound. More preferably, it is recommended that the alkali catalyst is added in an amount in a range of 0.01 to 0.8 moles.

Usually, the alkali catalyst is preferably diluted with water and/or a water-soluble organic solvent, and used as an alkali catalyst solution. It should be noted that water contained in this water-soluble organic solvent also contributes to the hydrolysis, and this amount of water is included in the amount of water used in the hydrolysis.

Usually, the concentration of the alkali catalyst in the alkali catalyst solution is preferably in a range of 0.1% to 20% by mass. When the concentration is less than 0.1% by mass, a practical catalytic function may not be obtained. When the concentration exceeds 20% by mass, the catalytic function often reaches equilibrium, and therefore, the alkali catalyst may be excessively used.

With regard to the concentration of the alkali catalyst in the alkali catalyst solution, more preferably, a range of 1% to 15% by mass is recommended. Still more preferably, a range of 2% to 12% by mass is recommended.

For example, an aqueous ammonia solution, a mixture of an aqueous ammonium solution and ethanol, or the like can be suitably used as the alkali catalyst solution.

[Production Steps]

A preferred process for producing a silica sol according to the present invention will be described below, but the process for producing a silica sol according to the present invention is not limited thereto. The temperature of the above-described mixed solvent containing a water-soluble organic solvent and water is maintained in a range of 30° C. to 150° C., and 1) a water-soluble organic solvent solution of a tetrafunctional silane compound and 2) an aqueous alkali catalyst solution are simultaneously and continuously or intermittently added to the mixed solvent over a period of 30 minutes to 20 hours. With regard to the above temperature range, a temperature lower than 30° C. is not preferable because hydrolysis and condensation do not sufficiently proceed. When the temperature exceeds the boiling point of the mixed solvent, this step can be performed using a pressure-resistant container such as an autoclave. However, a temperature exceeding 150° C. is not industrially desirable because a very high pressure is applied.

With regard to this temperature range, preferably, a range of 40° C. to 100° C. is recommended. More preferably, a range of 50° C. to 80° C. is recommended. With regard to the range of time necessary for the addition, preferably a range of 1 to 15 hours is recommended. More preferably, a range of 2 to 10 hours is recommended.

Preferably, 1) the water-soluble organic solvent solution of a tetrafunctional silane compound and 2) the aqueous alkali catalyst solution are simultaneously and continuously or intermittently added to the mixed solvent containing a water-soluble organic solvent and water over a period of 30 minutes to 20 hours. When the total of the two solutions is added at one time, the hydrolysis and condensation rapidly proceed, resulting in the generation of a gel product. Consequently, silica fine particles cannot be obtained.

In the production process according to the present invention, as described above, a silica sol is prepared by using a characteristic of the rate of reaction of a tetrafunctional silane compound. For example, when tetramethoxysilane is used, the rate of hydrolysis reaction is higher than that in the case where tetraethoxysilane is used. Accordingly, in this case, it is not easy to form a silica sol, unlike the case of tetraethoxysilane.

After the completion of the addition of the components necessary for the hydrolysis and condensation, as required, the resulting liquid is maintained in a range of 30° C. to 150° C. for 0.5 to 10 hours to perform aging. For example, in the case where an unreacted tetrafunctional silane compound remains, the reaction of the unreacted tetrafunctional silane compound can be accelerated and completed by aging. Aggregation or precipitation of silica may occur with time depending on the amount of residual unreacted tetrafunctional silane compound. With regard to the temperature range during the aging, preferably, a range of 40° C. to 100° C. is recommended, and more preferably, a range of 50° C. to 80° C. is recommended. With regard to the aging time range, preferably a range of one to nine hours is recommended, and more preferably a range of two to eight hours is recommended. The prepared silica sol is concentrated if necessary. An ultrafiltration membrane method, a distillation method, a combination of these methods, or the like is usually employed as the concentration method. The concentration of the silica sol after the concentration is in a range of about 1% to 50% by mass on a $SiO_2$ basis. The silica sol is diluted or further concentrated as required when being used.

Organosol

The non-spherical silica sol of the present invention can be formed into an organosol by replacing with an organic solvent. A known method can be employed as the replacing method. When the boiling point of the organic solvent is substantially higher than that of water, an organosol can be obtained by adding the organic solvent and distilling the resulting mixture. On the other hand, when the boiling point of the organic solvent is low, an organosol can be obtained by the ultrafiltration membrane method disclosed in Japanese Unexamined Patent Application Publication No. 59-8614 applied by the applicant of the present application. The concentration of the organosol obtained is in a range of 1% to 50% by weight on a $SiO_2$ basis. The organosol may be diluted or further concentrated as required when being used.

[Polishing Material and Composition for Polishing]

The non-spherical silica sol of the present invention is useful as a polishing material and a composition for polishing.

Specifically, the non-spherical silica sol of the present invention can be used as a polishing material by itself, and can also constitute an ordinary composition for polishing together with other components (such as a polishing accelerator).

The composition for polishing according to the present invention includes the above-described non-spherical silica fine particles dispersed in a solvent. As the solvent, water is usually used, but alcohols such as methyl alcohol, ethyl alcohol, and isopropyl alcohol can be used as required. Besides, water-soluble organic solvents such as ethers, esters, and ketones can also be used. The concentration of the non-spherical silica fine particles in the composition for polishing is preferably in a range of 2% to 50% by weight, and more preferably in a range of 5% to 30% by weight. When the concentration is less than 2% by weight, in some types of base materials or insulating films, the concentration is too low, and the polishing rate is low, resulting in a problem in terms of productivity. When the concentration of the silica particles exceeds 50% by weight, the stability of the polishing material is insufficient and a further improvement of the polishing rate or the polishing efficiency is also not achieved. Furthermore, in a step of supplying a dispersion liquid for a polishing treatment, a dry substance may be generated and may adhere, which may become a cause of the generation of scratches.

Known other components such as hydrogen peroxide, peracetic acid, urea peroxide, and a mixture thereof may be optionally added to the composition for polishing according to the present invention, though the type of component depends on the type of material to be polished. When such a component, e.g., hydrogen peroxide is added to the composition for polishing, in the case where the material to be polished is a metal, the polishing rate can be efficiently improved. Furthermore, acids such as hydrochloric acid, sulfuric acid, nitric acid, phosphoric acid, polyphosphoric acid, amidosulfuric acid, and hydrofluoric acid; sodium salts, potassium salts, and ammonium salts of any of these acids; and mixture of these may be optionally added. In this case, when a material composed of two or more types of materials is polished, a flat polished surface can be finally obtained by increasing or decreasing the polishing rate of a material to be polished, the material constituting a specific component.

As another additive, for example, in order to prevent corrosion of a base material by forming a passivation layer or a dissolution-suppressing layer on a surface of a metal material to be polished, imidazole, benzotriazole, benzothiazole, or the like can be used. In order to disturb the passivation layer, a complexing agent such as an organic acid, e.g., citric acid, lactic acid, acetic acid, oxalic acid or phthalic acid; or a salt of any of these organic acids may also be used. Other examples of the organic acids include carboxylic acids, organic phosphoric acids, and amino acids. Examples of the carboxylic acids include monovalent carboxylic acids such as acetic acid, glycolic acid, and ascorbic acid; divalent carboxylic acids such as oxalic acid and tartaric acid; and trivalent carboxylic acids such as citric acid. Examples of the organic phosphoric acids include 2-aminoethyl phosphonic acid, 1-hydroxyethylidene-1,1-diphosphonic acid, aminotri(methylenephosphonic acid), ethylenediaminetetra(methylenephosphonic acid), and diethylenetriaminepenta(methylenephosphonic acid). Examples of the amino acids include glycine and alanine. Among these, from the standpoint of reducing scratches, inorganic acids, carboxylic acids, and organic phosphoric acids are preferable. For example, hydrochloric acid, nitric acid, sulfuric acid, phosphoric acid, polyphosphoric acid, glycolic acid, oxalic acid, citric acid, aminotri(methylenephosphonic acid), ethylenediaminetetra(methylenephosphonic acid), and diethylenetriaminepenta(methylenephosphonic acid) are preferable. These compounds can be used as an acid for adjusting the pH.

In order to improve the dispersibility and the stability of a polishing material slurry, a cationic, anionic, nonionic, or amphoteric surfactant can be appropriately selected and added. Furthermore, for example, in order to increase the effect of each of the above additives, the pH of the polishing material slurry can be adjusted by adding an acid or a base, as required.

Preferred Embodiment 1

A non-spherical silica sol contains non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.8, and a specific surface area in a range of 10 to 800 $m^2/g$. In this non-spherical silica sol, the non-spherical silica fine particles have a plurality of wart-like projections on the surfaces thereof. Furthermore, when an X-Y curve is drawn, where, in a plane containing a major axis of each of the non-spherical silica fine particles, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values.

Preferred Embodiment 2

A non-spherical silica sol characterized by containing non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.8, and a specific surface area in a range of 10 to 800 $m^2/g$. In this non-spherical silica sol, the non-spherical silica fine particles have a plurality of wart-like projections on the surfaces thereof. When an X-Y curve is drawn, where, in a plane containing a major axis of each of the non-spherical silica fine particles, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values. Furthermore, when, in the plane containing the major axis of each of the non-spherical silica fine particles, the distance from an arbitrary point on the outer edge of the non-spherical silica fine particle to the intersection point B of a line passing through the point on the outer edge and orthogonal to the major axis and the major axis is defined as Y, the distance Y has a coefficient of variation in a range of 5% to 50%.

Preferred Embodiment 3

A composition for polishing contains a non-spherical silica sol containing non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.8, and a specific surface area in a range of 10 to 800 $m^2/g$. In the non-spherical silica sol, the non-spherical silica fine particles have a plurality of wart-like projections on the surfaces thereof; and furthermore, when an X-Y curve is drawn, where, in a plane containing a major axis of each of the non-spherical silica fine particles, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values.

Preferred Embodiment 4

A composition for polishing contains a non-spherical silica sol containing non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.8, and a specific surface area in a range of 10 to 800 m²/g. In the non-spherical silica sol, the non-spherical silica fine particles have a plurality of wart-like projections on the surfaces thereof; when an X-Y curve is drawn, where, in a plane containing a major axis of each of the non-spherical silica fine particles, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values. Furthermore, when, in the plane containing the major axis of each of the non-spherical silica fine particles, the distance from an arbitrary point on the outer edge of the non-spherical silica fine particle to the intersection point B of a line passing through the point on the outer edge and orthogonal to the major axis and the major axis is defined as Y, the distance Y has a coefficient of variation in a range of 5% to 50%.

Preferred Embodiment 5

A non-spherical silica sol contains non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.8, and a specific surface area in a range of 10 to 800 m²/g. In this non-spherical silica sol, when an X-Y curve is drawn, where, in a plane containing a major axis of each of the non-spherical silica fine particles, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values. Furthermore, when, in the plane containing the major axis of each of the non-spherical silica fine particles, the distance from an arbitrary point on the outer edge of the non-spherical silica fine particle to an intersection point B of a line passing through the point on the outer edge and orthogonal to the major axis and the major axis is defined as Y, the distance Y has a coefficient of variation in a range of 5% to 50%.

Preferred Embodiment 6

A non-spherical silica sol contains non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.8, and a specific surface area in a range of 10 to 800 m²/g. In this non-spherical silica sol, when an X-Y curve is drawn, where, in a plane containing a major axis of each of the non-spherical silica fine particles, the distance from an arbitrary point on an outer edge of the non-spherical silica fine particle to an intersection point B of a line passing through the point on the outer edge and orthogonal to the major axis and the major axis is defined as Y, and the distance from one intersection point A of the outer edge of the non-spherical silica fine particle and the major axis to the intersection point B is defined as X, the X-Y curve has a plurality of local maximum values. Furthermore, when, in the plane containing the major axis of each of the non-spherical silica fine particles, the distance from an arbitrary point on the outer edge of the non-spherical silica fine particle to an intersection point B of a line passing through the point on the outer edge and orthogonal to the major axis and the major axis is defined as Y, the distance Y has a coefficient of variation in a range of 5% to 50%. In this non-spherical silica sol, the non-spherical silica fine particles are composed of polysiloxane including a $[SiO_{4/2}]$ unit obtained by hydrolysis of tetraethoxysilane, and the content of sodium is 100 mass ppm or less.

[Analytical Methods Used in Examples and Comparative Examples]

[1] Method for Measuring Average Particle Diameter ($D_1$) by Dynamic Light Scattering With regard to the average particle diameter measured by dynamic light scattering, an average particle diameter was measured by dynamic light scattering with a laser beam using a particle size distribution measuring apparatus (manufactured by Particle Sizing Systems, NICOMP MODEL 380).

[2] Method for Measuring Number of Local Maximum Values of Distance Y from Outer Edge to Major Axis of Particle In a scanning electron microscopy image (250,000 to 500,000 times) of a non-spherical silica fine particle, a major axis of the non-spherical silica fine particle is determined, and the entire length of the major axis is equally divided into 40 portions. The distance between each point (point B) after the division and an intersection point of a line passing through the point and orthogonal to the major axis, the line extending to one side of the fine particle, and an outer edge of the fine particle is recorded as Y. In addition, the length from one intersection point (point A) out of two intersection points of the outer edge of the non-spherical silica fine particle and the major axis to each point (point B) after the division is defined as X. Y is taken as the vertical axis, and X is taken as the horizontal axis. The values of Y corresponding to the values of X are plotted, thereby drawing an X-Y curve. The number of local maximum values of this X-Y curve can be determined.

In the present application, this measurement was performed for 50 non-spherical silica fine particles. The average of the number of local maximum values was determined and was defined as the number of local maximum values of the distance Y from the outer edge to the major axis of the particle.

[3] Method for Calculating Coefficient of Variation (CV Value) of Distance Y from Outer Edge to Major Axis of Particle With regard to the measurement of the coefficient of variation of the distance Y from the outer edge to the major axis of a fine particle in the present invention, the coefficient of variation was calculated by the following method.

1) A distance (major axis radius M) from the center point of the major axis to one outer edge of a fine particle was measured. Points of 0% to 50% were plotted on the major axis from the center point at intervals of 5% of the major axis radius M.

2) On each of the plotted points, a line orthogonal to the major axis was drawn. A distance Y from a point at which this line intersects with the outer edge of the fine particle on one side to each plotted point was measured.

3) With regard to the coefficient of variation (CV value) with respect to the distance Y from the outer edge to the major axis of the fine particle, the coefficients of variation (CV values) were calculated on the major axis in a range from the center point, i.e., 0%, to 10% of the major axis radius M, and similarly in a ranges of 0% to 20%, 0% to 30%, 0% to 40%, and 0% to 50% of the major axis radius M. Thus, five coefficients of variation (CV values) were determined Among these coefficients of variation, the maximum coefficient of variation (CV value) was defined as the coefficient of variation (CV value) with respect to the distance Y in the particle.

4) The measurements described in 1) to 3) were performed for 50 particles, and the average of the results was determined as the coefficient of variation (CV value) with respect to the distance Y in non-spherical silica fine particles.

[4] Measurement of Specific Surface Area and Measurement of Average Particle Diameter by Sears Method 1) A sample corresponding to 15 g on a $SiO_2$ basis was placed in a beaker, and the beaker was then transferred to a constant-temperature reaction chamber (25° C.). Pure water was added to the sample so that the volume of the liquid reached 90 mL (The following operations were conducted in the constant-temperature reaction chamber maintained at 25° C.)

2) A 0.1 mol/L aqueous hydrochloric acid solution was added so that the pH was adjusted to be 3.6.

3) Thirty grams of sodium chloride was added thereto. The resulting solution was diluted with pure water so that the total volume reached 150 mL, and the solution was stirred for 10 minutes.

4) A pH electrode was set, and a 0.1 mol/L sodium hydroxide solution was added dropwise to the solution under stirring to adjust the pH to be 4.0.

5) The sample, the pH of which was adjusted to be 4.0, was titrated with the 0.1 mol/L sodium hydroxide solution. In a pH range of 8.7 to 9.3, four or more points of titration values and pH values were recorded. Each of the titration values of the 0.1 mol/L sodium hydroxide solution was represented by X, and each of the pH values at the corresponding titration value was represented by Y, thus preparing a calibration curve.

6) An amount of consumption V (mL) of the 0.1 mol/L sodium hydroxide solution required for adjusting the pH to be 4.0 to 9.0 per 15 g of $SiO_2$ was determined from formula (2) below. A specific surface area SA [m²/g] was determined in accordance with formula (3) below.

The average particle diameter $D_1$ (nm) was determined from formula (4).

$$V=(A \times f \times 100 \times 15)/(W \times C) \quad (2)$$

$$SA=29.0V-28 \quad (3)$$

$$D1=6{,}000/(\rho \times SA) \quad (4)$$

(Here, ρ represents the density (g/cm³) of particles and 2.2 is substituted for ρ in the case of silica.)

However, the meanings of the symbols in formula (2) above are as follows:

A: Titration value (mL) of 0.1 mol/L sodium hydroxide solution required for adjusting the pH to be 4.0 to 9.0 per 15 g of $SiO_2$ f: Titer of 0.1 mol/L sodium hydroxide solution C: $SiO_2$ concentration (%) of sample W: Weight of sample (g)

[5] Measurement of Specific Surface Area by BET Method (Nitrogen Adsorption Method)

The pH of 50 mL of a non-spherical silica sol was adjusted to be 3.5 with $HNO_3$. Forty milliliters of 1-propanol was added to the non-spherical silica sol, and the resulting mixture was dried at 110° C. for 16 hours to prepare a sample. The sample was crushed with a mortar, and was then baked in a muffle furnace at 500° C. for one hour to prepare a sample for measurement. Next, the specific surface area was calculated by a BET one point method from the amount of nitrogen adsorption with a specific surface area measuring apparatus (manufactured by Yuasa Ionics Inc., model: Multisorb 12) using a nitrogen adsorption method (BET method). Specifically, 0.5 g of the sample was placed in a measuring cell, and a degas process was performed at 300° C. for 20 minutes in a stream of a mixed gas containing 30% by volume of nitrogen and 70% by volume of helium. Subsequently, the temperature of the sample was maintained at a liquid nitrogen temperature in a stream of the above mixed gas so that the sample was subjected to equilibrium adsorption of nitrogen. Next, the temperature of the sample was gradually increased to room temperature while supplying the mixed gas, and the amount of nitrogen desorbed during this temperature increasing was detected. The specific surface area of the non-spherical silica sol was calculated using the calibration curve prepared in advance. Furthermore, the average particle diameter $D_1$ was determined by substituting the determined specific surface area (SA) for formula (4) above.

[6] Method for Measuring Minor-Diameter/Major-Diameter Ratio

In a photographic projection image obtained by taking a photograph of a non-spherical silica sol sample with a scanning electron microscope (manufactured by Hitachi Ltd., H-800) at a magnification of 250,000 times (to 500,000 times), the maximum diameter of a particle is defined as a major axis. The length of the major axis was measured and defined as a major diameter (DL). Furthermore, a point that divides the major axis in half was determined on the major axis, and two points at which a line passing through the above point and orthogonal to the major axis intersects with the outer edge of the particle were determined. The distance between the two points was measured and defined as a minor diameter (DS). A ratio (DS/DL) was then determined. This measurement was performed for arbitrary 50 particles, and the average of the results was determined as a minor-diameter/major-diameter ratio. Note that, in the case where a plurality of major axes can be determined for one particle, the average of the lengths of a plurality of corresponding minor diameters was determined, and defined as the length of the minor diameter (DS).

[7] Measurement of Ratio of Non-Spherical Silica Fine Particles

In the 50 particles which were the measurement targets of the minor-diameter/major-diameter ratio in "[6] Method for measuring minor-diameter/major-diameter ratio", the total number (n) of particles corresponding to (i) below and particles corresponding to (ii) below was measured. The value $[(50-n)/50]\times100$ was defined as a ratio (%) of the number of non-spherical silica fine particles having wart-like projections to the total number of silica fine particles serving as a dispersoid.

(i) Particles in which the minor-diameter/major-diameter ratio is out of a range of 0.01 to 0.8
(ii) Particles in which the minor-diameter/major-diameter ratio is within a range of 0.01 to 0.8 but which have no wart-like projections

[8] Method for Evaluating Polishing Property for Aluminum Substrate

Preparation of Slurry for Polishing

A silica sol sample was prepared so that the silica concentration was 20% by mass. Hydrogen peroxide ($H_2O_2$), HEDP (1-hydroxyethylidene-1,1-diphosphonic acid), and ultrapure water were added thereto to prepare a slurry for polishing, the slurry containing 9% by weight of silica, 0.5% by weight of $H_2O_2$, and 0.5% by weight of 1-hydroxyethylidene-1,1-diphosphonic acid. Nitric acid ($HNO_3$) was further added as required to prepare the slurry for polishing with a pH of 2.

Substrate to be Polished

A substrate for an aluminum disk was used as a substrate to be polished. This substrate for an aluminum disk was a substrate (95 mm$\phi$/25 mm$\phi$–1.27 mmt) including an aluminum substrate and a Ni—P layer (a hard Ni—P plating layer having a composition of 88% of Ni and 12% of P) having a thickness of 10 μm, the Ni—P layer being formed on the aluminum substrate by electroless plating. This substrate was subjected to primary polishing, and had a surface roughness (Ra) of 0.17 nm.

Polishing Test

The substrate to be polished was set on a polishing device (manufactured by Nano Factor Co., Ltd., NF300), and was polished using a polishing pad (manufactured by Rodel, "Apolon") at a substrate load of 0.05 MPa and a table rotational speed of 30 rpm while supplying the slurry for polishing at a rate of 20 g/min for 5 minutes.

A change in the weight of the substrate to be polished before and after the polishing was determined to calculate a polishing rate [nm/min].

Measurement of Scratches (Linear Streaks)

The generation of scratches was evaluated as follows. A substrate for an aluminum disk was polished by the same method as that described above. The entire surface of the substrate was then observed with an ultrafine defect visualization macro-apparatus (manufactured by VISION PSYTEC, product name: Micro-MAX) at Zoom 15. The number of scratches (linear streaks) on a surface of the polished substrate, the surface having an area corresponding to 65.97 cm$^2$, was counted, and the total number of scratches was determined.

[9] Method for Evaluating Polishing Property for Glass Substrate

Preparation of Slurry for Polishing

A silica sol sample was prepared so that the silica concentration was 20% by mass. Ultrapure water and a 5% by mass aqueous sodium hydroxide solution were further added thereto to prepare a slurry for polishing, the slurry containing 9% by weight of silica and having a pH of 10.5.

Substrate to be Polished

A glass substrate for a hard disk, the glass substrate having a diameter $\phi$ of 65 mm and composed of reinforced glass, was used as a substrate to be polished. This glass substrate for a hard disk was subjected to primary polishing, and had a surface roughness of 0.21 μm at a maximum.

Polishing Test

The substrate to be polished was set on a polishing device (manufactured by Nano Factor Co., Ltd., NF300), and was polished using a polishing pad (manufactured by Rodel, "Apolon") at a substrate load of 0.18 MPa and a table rotational speed of 30 rpm while supplying the slurry for polishing at a rate of 20 g/min for 10 minutes.

A change in the weight of the substrate to be polished before and after the polishing was determined to calculate a polishing rate [nm/min]

Measurement of Scratches (Linear Streaks)

The generation of scratches was evaluated as follows. A glass substrate was polished by the same method as that described above. The entire surface of the substrate was then observed with an ultrafine defect visualization macro-apparatus (manufactured by VISION PSYTEC, product name: Micro-MAX) at Zoom 1. The number of scratches (linear streaks) on a surface of the polished substrate, the surface having an area corresponding to 65.97 cm$^2$, was counted, and the total number of scratches was determined.

[10] Method for Evaluating Polishing Property for Thermally Oxidized Film

Preparation of Slurry for Polishing

Potassium hydroxide (KOH) was added to a silica sol having a silica concentration of 12.6% by mass, the silica sol being prepared in each of Examples and Comparative Examples, to adjust the pH to be 10.

Substrate to be Polished

A thermally oxidized film substrate prepared by performing wet thermal oxidation of a silicon wafer at 1,050° C. was used as a substrate to be polished.

Polishing Test

The substrate to be polished was set on a polishing device (manufactured by Nano Factor Co., Ltd., NF330), and was polished using a polishing pad (manufactured by Rodel, "IC-1000") at a substrate load of 0.05 MPa and a table rotational speed of 30 rpm while supplying the slurry for polishing at a rate of 20 g/min for 5 minutes. The film thicknesses before and after the polishing were measured with a short-wavelength ellipsometer to calculate the polishing rate.

[11] Method for Quantitatively Determining Sodium

The content of sodium was measured by the following procedure.

1) About 10 g of a silica sol sample was placed on a platinum dish, and weighed on the order of 0.1 mg.
2) Five milliliters of nitric acid and 20 mL of hydrofluoric acid were added, and the resulting mixture was heated on a sand bath to evaporate to dryness.
3) When the amount of liquid became small, 20 mL of hydrofluoric acid were further added, and the mixture was heated on the sand bath to evaporate to dryness.
4) The resulting solid matter was cooled to room temperature. Subsequently, 2 mL of nitric acid and about 50 mL of water were added thereto, and the solid matter was dissolved by heating on the sand bath.

5) The solution was cooled to room temperature, and was then placed in a flask (100 mL) The solution was diluted with water so that the total volume reached 100 mL to prepare a sample solution.

6) The content of sodium metal contained in the sample solution was measured with an atomic absorption spectrophotometer (manufactured by Hitachi Ltd., Z-5300, measurement mode: atomic absorption, measurement wavelength: 190 to 900 nm, detection wavelength of Na in the case of silica sample: 589.0 nm). In this atomic absorption spectrophotometer, a sample was converted into an atomic vapor by a flame, the resulting atomic vapor layer was irradiated with light having an appropriate wavelength, and the intensity of light absorbed by an atom during the light irradiation was measured. Thus, the concentration of an element in the sample was quantitatively determined.

7) Two milliliters of a 50% aqueous sulfuric acid solution was added to 10 g of the silica sol sample, and the mixture was evaporated to dryness on a platinum dish. The resulting solid matter was baked at 1,000° C. for one hour, and was then cooled and weighed. Next, the weighed solid matter was dissolved in a small amount of a 50% aqueous sulfuric acid solution, and 20 mL of hydrofluoric acid was further added thereto. The resulting mixture was then evaporated to dryness on a platinum dish. The resulting solid matter was baked at 1,000° C. for 15 minutes, and was then cooled and weighed. The silica content was determined from the difference between these weights.

8) The ratio of Na to the $SiO_2$ content was calculated from the results of 6) and 7) above.

Synthesis Example 1

In a separable flask equipped with a reflux condenser and a stirrer, 18.7 g of an aqueous sodium silicate solution ($SiO_2/Na_2O$ molar ratio 3) having a $SiO_2$ concentration of 24% by weight was placed, and 837 g of water was further added thereto. Thus, 855 g of an aqueous sodium silicate solution was prepared. Next, 1,067 g of a silicic acid solution (pH 2.3, $SiO_2/Na_2O$ molar ratio=1,200) having a $SiO_2$ concentration of 4.82% by weight, the silicic acid solution being prepared by allowing sodium silicate ($SiO_2/Na_2O$ molar ratio 3) having a $SiO_2$ concentration of 4.82% by weight to pass through a cation-exchange resin column, was added to the aqueous sodium silicate solution. Thus, a mixed liquid ($SiO_2/Na_2O$ molar ratio 35) containing the silicic acid solution and the aqueous sodium silicate solution was prepared.

The mixed liquid was heated, and aged at a temperature of 98° C. for 30 minutes. Subsequently, 1,162 g of a silicic acid solution having the same composition as that of the above-mentioned silicic acid solution was added to this liquid over a period of four hours while maintain the temperature of the liquid at 98° C. Thus, a non-spherical silica sol having a pH of 8.9 was prepared. The $SiO_2/Na_2O$ molar ratio of this non-spherical silica sol was 76.

A 2.5% aqueous sulfuric acid solution was added so that the pH of this non-spherical silica sol became 8.5, and the resulting silica sol was heated at 90° C. for eight hours. The silica sol was then concentrated with an evaporator until the $SiO_2$ concentration became 20% by weight to prepare a non-spherical silica sol.

The non-spherical silica fine particles contained in this non-spherical silica sol had an average particle diameter of 12 nm calculated from a specific surface area measured by the BET method, and an average particle diameter of 34 nm measured by dynamic light scattering. The non-spherical silica fine particles had a minor-diameter/major-diameter ratio of 0.45, and a specific surface area of 220 m²/g.

Synthesis Example 2

One hundred grams of a silica sol (average particle diameter measured by BET method: 35 nm, specific surface area: 182 m²/g, $SiO_2$ concentration: 30% by weight) was repeatedly passed through 0.4 L of a strongly acidic cation-exchange resin SK1BH (manufactured by Mitsubishi Chemical Corporation) at a space velocity of 3.1 until the pH became 2.3. Next, the silica sol was passed through 0.4 L of a strongly basic ion-exchange resin SANUPC (manufactured by Mitsubishi Chemical Corporation) at a space velocity of 3.1 to adjust the pH to be 5.6. Next, 5.4 g of a 5% aqueous ammonia solution was added as an aqueous alkaline solution so that the pH became 7.8. The resulting mixture was heated at 90° C. for 30 hours. This non-spherical silica sol was concentrated with an evaporator until the $SiO_2$ concentration became 20% by weight to prepare a non-spherical silica sol.

This non-spherical silica sol had an average particle diameter of 35 nm measured by the BET method, and an average particle diameter of 70 nm measured by dynamic light scattering. The non-spherical silica sol had a minor-diameter/major-diameter ratio of 0.4, and a specific surface area of 180 m²/g.

Synthesis Example 3

An aqueous sodium silicate solution ($SiO_2/Na_2O$ molar ratio 3.1) having a $SiO_2$ concentration of 24% by weight was diluted with ion-exchanged water to prepare 1 Kg of an aqueous sodium silicate solution (pH 11.3) having a $SiO_2$ concentration of 5% by weight.

This aqueous soda silicate solution was neutralized by adding sulfuric acid so that the pH of the solution became 6.5. The solution was maintained at room temperature for one hour to prepare silica hydrogel. This silica hydrogel was sufficiently washed with a 28% aqueous ammonia solution (in an amount corresponding to about 120 times the $SiO_2$ solid content) with an Oliver filter to remove salts. The concentration of sodium sulfate after the washing was less than 0.01% relative to the $SiO_2$ solid content.

The prepared silica hydrogel was dispersed in pure water (silica concentration 3% by weight) using a powerful stirrer to prepare a silica hydrogel dispersion liquid in the form of flowable slurry. A 1:1 mixture of an aqueous NaOH solution having a concentration of 5% by weight and a 28% aqueous ammonia solution was added to the dispersion liquid so that the $SiO_2/Na_2O$ molar ratio became 75. The resulting mixture was heated at 160° C. for one hour.

Next, 0.81 Kg of 24% sodium silicate and 10.93 Kg of pure water were added to 2.09 Kg of the above non-spherical silica sol to prepare 13.83 Kg (pH 11.2) of a seed sol. This seed sol had an average particle diameter of 17 nm measured by dynamic light scattering.

Next, 117.2 Kg of a silicic acid solution described below and having a $SiO_2$ concentration of 4.5% by weight was added to the seed sol over a period of 10 hours while maintaining the temperature of the seed sol to be 90° C. After the completion of the addition, the mixture was cooled to room temperature. The resulting non-spherical silica sol was concentrated with an ultrafiltration membrane until the $SiO_2$ concentration became 20% by weight.

This non-spherical silica sol had an average particle diameter of 50 nm measured by the BET method, and an average particle diameter of 100 nm measured by dynamic light scattering. The non-spherical silica sol had a minor-diameter/major-diameter ratio of 0.3, and a specific surface area of 50 m$^2$/g.

Synthesis Example 4

In a separable flask equipped with a reflux condenser and a stirrer, 18.7 g of an aqueous sodium silicate solution (SiO$_2$/Na$_2$O molar ratio 3) having a SiO$_2$ concentration of 24% by weight and a Na$_2$O concentration of 8.16% by weight was placed, and 895 g of water was further added thereto. Thus, 914 g of an aqueous sodium silicate solution was prepared.

Next, 1,900 g of a silicic acid solution (pH 2.3, SiO$_2$/Na$_2$O molar ratio=1,200) having a SiO$_2$ concentration of 4.82% by weight, the silicic acid solution being prepared by allowing sodium silicate (SiO$_2$/Na$_2$O molar ratio 3) having a SiO$_2$ concentration of 4.82% by weight to pass through a cation-exchange resin column, was added to the aqueous sodium silicate solution under a temperature condition of 35° C. Thus, a mixed liquid (SiO$_2$/Na$_2$O molar ratio 60) containing the silicic acid solution and the aqueous sodium silicate solution was prepared.

The mixed liquid was heated, and aged at a temperature of 80° C. for 30 minutes. Subsequently, 329 g of a silicic acid solution having the same composition as that of the above-mentioned silicic acid solution was added to this liquid over a period of two hours while maintain the temperature of the liquid at 80° C. Thus, a non-spherical silica sol having a pH of 8.7 was prepared. The SiO$_2$/Na$_2$O molar ratio of this non-spherical silica sol was 76.

The non-spherical silica sol was heated at 70° C. for 12 hours. The non-spherical silica sol was then concentrated with an evaporator until the SiO$_2$ concentration became 20% by weight. This non-spherical silica sol had an average particle diameter of 6 nm converted from a specific surface area measured by the BET method, and an average particle diameter of 12 nm measured by dynamic light scattering. The minor-diameter/major-diameter ratio was 0.15, and the specific surface area was 455 m$^2$/g.

All Examples below satisfy the conditions of Claims of the invention of this application.

EXAMPLES

Example 1

Preparation of Core Particle Dispersion Liquid

A non-spherical silica sol (average particle diameter measured by dynamic light scattering: 24 nm, minor-diameter/major-diameter ratio: 0.45, SiO$_2$ concentration: 20% by mass) prepared by the same method as that described in Synthesis Example 1 was diluted with pure water so that the total weight became 4,170 g (SiO$_2$ concentration 1% by mass). Furthermore, an aqueous sodium hydroxide solution having a concentration of 5% by mass was added thereto so that the pH of the silica sol became 11. Subsequently, the temperature of the silica sol was increased to 80° C., and the silica sol was maintained at 80° C. for 30 minutes to prepare a core particle dispersion liquid (liquid A).

Growth of Core Particles

First, 575 g of water glass (manufactured by Dokai Chemical Industries Co., Ltd., JIS No. 3 water glass, SiO$_2$ concentration 24% by mass) was diluted with 2,185 g of water to prepare 2,760 g of an aqueous alkali silicate solution (liquid B). In addition, 2,352 g of water was added to 98.0 g of ammonium sulfate (manufactured by Mitsubishi Chemical Corporation) serving as an electrolyte to prepare 2,450 g of an aqueous electrolyte solution. Next, the total amounts of the aqueous alkali silicate solution (liquid B) and the aqueous electrolyte solution were each added to the total amount of the core particle dispersion liquid (liquid A), the temperature of which was maintained at 80° C., over a period of one hour at 80° C. to grow particles.

Here, a ratio EA/EE of the number of equivalents of the alkali contained in the liquid B to the number of equivalents of the electrolyte was 1.0. Subsequently, aging was conducted at 80° C. for one hour, and washing was then conducted with an ultrafiltration membrane until the pH of the core particle dispersion liquid, in which the particle growth had been performed, became 9.1. Subsequently, the liquid was concentrated to prepare a non-spherical silica sol having a SiO$_2$ concentration of 20% by mass. Characteristics of the prepared non-spherical silica sol are shown in Table 3. In addition, this non-spherical silica sol was evaluated in accordance with the method for evaluating a polishing property for an aluminum substrate described in [8] above. The evaluation results are shown in Table 3. (Hereinafter, with regard to Examples 2 and 3 and Comparative Examples 1 and 2, the evaluation results obtained by the method for evaluating a polishing property for an aluminum substrate described in [8] are similarly shown in Table 3.) Production conditions for the non-spherical silica sol are shown in Tables 1 and 2.

Example 2

Preparation of Core Particle Dispersion Liquid

A non-spherical silica sol (average particle diameter measured by dynamic light scattering: 12 nm, minor-diameter/major-diameter ratio: 0.15, SiO$_2$ concentration: 20% by mass) prepared by the same method as that described in Synthesis Example 4 was diluted with pure water so that the total weight became 4,170 g (SiO$_2$ concentration 1% by mass). Furthermore, an aqueous sodium hydroxide solution having a concentration of 5% by mass was added thereto so that the pH of the silica sol became 11. Subsequently, the temperature of the silica sol was increased to 65° C., and the silica sol was maintained at 65° C. for 30 minutes to prepare a core particle dispersion liquid (liquid A).

Growth of Core Particles

First, 575 g of water glass (manufactured by Dokai Chemical Industries Co., Ltd., JIS No. 3 water glass, SiO$_2$ concentration 24% by mass) was diluted with 2,185 g of water to prepare 2,760 g of an aqueous alkali silicate solution (liquid B). In addition, 2,352 g of water was added to 98.0 g of ammonium sulfate (manufactured by Mitsubishi Chemical Corporation) serving as an electrolyte to prepare 2,450 g of an aqueous electrolyte solution. Next, total amounts of the aqueous alkali silicate solution (liquid B) and the aqueous electrolyte solution were each added to the total amount of the core particle dispersion liquid (liquid A), the temperature of which was maintained at 65° C., over a period of one hour at 65° C. to grow particles. Here, a ratio EA/EE of the number of equivalents of the alkali contained in the liquid B to the number of equivalents of the electrolyte was 1.0. Subsequently, aging was conducted at 65° C. for one hour, and washing was then conducted with an ultrafiltration membrane until the pH of the core particle dispersion liquid, in which the particle growth had been performed, became 9.4. Subsequently, the liquid was concentrated to prepare a non-spherical silica sol having a SiO$_2$ concentration of 20% by mass. Characteristics of the prepared non-spherical silica sol are shown in Table 3. Production conditions for the non-spherical silica sol are shown in Tables 1 and 2.

Example 3

Preparation of Core Particle Dispersion Liquid

A non-spherical silica sol (average particle diameter measured by dynamic light scattering: 70 nm, minor-diameter/major-diameter ratio: 0.4, $SiO_2$ concentration: 20% by mass) prepared by the same method as that described in Synthesis Example 2 was diluted with pure water so that the total weight became 4,170 g ($SiO_2$ concentration 1% by mass). Furthermore, an aqueous sodium hydroxide solution having a concentration of 5% by mass was added thereto so that the pH of the silica sol became 11. Subsequently, the temperature of the silica sol was increased to 95° C., and the silica sol was maintained at 95° C. for 30 minutes to prepare a core particle dispersion liquid (liquid A).

Growth of Core Particles

First, 575 g of water glass (manufactured by Dokai Chemical Industries Co., Ltd., JIS No. 3 water glass, $SiO_2$ concentration 24% by mass) was diluted with 2,185 g of water to prepare 2,760 g of an aqueous alkali silicate solution (liquid B). In addition, 2,376 g of water was added to 74.2 g of ammonium nitrate (manufactured by Mitsubishi Chemical Corporation) serving as an electrolyte to prepare 2,450.2 g of an aqueous electrolyte solution. Next, total amounts of the aqueous alkali silicate solution (liquid B) and the aqueous electrolyte solution were each added to the total amount of the core particle dispersion liquid (liquid A), the temperature of which was maintained at 95° C., over a period of one hour at 95° C. to grow particles.

Here, a ratio EA/EE of the number of equivalents of the alkali contained in the liquid B to the number of equivalents of the electrolyte was 0.8. Subsequently, aging was conducted at 95° C. for one hour, and washing was then conducted with an ultrafiltration membrane until the pH of the core particle dispersion liquid, in which the particle growth had been performed, became 10. Subsequently, the liquid was concentrated to prepare a non-spherical silica sol having a $SiO_2$ concentration of 20% by mass. Characteristics of the prepared non-spherical silica sol are shown in Table 3. A scanning electron micrograph (magnification: 250,000 times) of the prepared non-spherical silica sol is shown in FIG. 3. Production conditions for the non-spherical silica sol are shown in Tables 1 and 2.

Example 4

Preparation of Core Particle Dispersion Liquid

A non-spherical silica sol (average particle diameter measured by dynamic light scattering: 100 nm, minor-diameter/major-diameter ratio: 0.30, $SiO_2$ concentration: 20% by mass) prepared by the same method as that described in Synthesis Example 3 was diluted with pure water so that the total weight became 3,890 g ($SiO_2$ concentration 1% by mass). Furthermore, an aqueous sodium hydroxide solution having a concentration of 5% by mass was added thereto so that the pH of the silica sol became 11. Subsequently, the temperature of the silica sol was increased to 80° C., and the silica sol was maintained at 80° C. for 30 minutes to prepare a core particle dispersion liquid (liquid A).

Growth of Core Particles

First, 588 g of water glass (manufactured by Dokai Chemical Industries Co., Ltd., JIS No. 3 water glass, $SiO_2$ concentration 24% by mass) was diluted with 2,232 g of water to prepare 2,820 g of an aqueous alkali silicate solution (liquid B). In addition, 2,412 g of water was added to 93.3 g of ammonium nitrate (manufactured by Mitsubishi Chemical Corporation) serving as an electrolyte to prepare 2,505.3 g of an aqueous electrolyte solution. Next, total amounts of the aqueous alkali silicate solution (liquid B) and the aqueous electrolyte solution were each added to the total amount of the core particle dispersion liquid (liquid A), the temperature of which was maintained at 80° C., over a period of one hour at 80° C. to grow particles.

Here, a ratio EA/EE of the number of equivalents of the alkali contained in the liquid B to the number of equivalents of the electrolyte was 0.65. Subsequently, aging was conducted at 80° C. for one hour, and washing was then conducted with an ultrafiltration membrane until the pH became 9.8. Subsequently, the liquid was concentrated to prepare a non-spherical silica sol having a $SiO_2$ concentration of 20% by mass. Characteristics of the prepared non-spherical silica sol are shown in Table 3.

In addition, the polishing property of the prepared non-spherical silica sol was evaluated in accordance with the method for evaluating a polishing property for a glass substrate described in [9] above. The evaluation results are shown in Table 3. (Hereinafter, with regard to Example 5, the evaluation results obtained by the method for evaluating a polishing property for a glass substrate described in [9] are similarly shown in Table 3.) Production conditions for the non-spherical silica sol are shown in Tables 1 and 2.

Example 5

Preparation of Core Particle Dispersion Liquid

A non-spherical silica sol (average particle diameter measured by dynamic light scattering: 100 nm, minor-diameter/major-diameter ratio: 0.30, $SiO_2$ concentration: 20% by mass) prepared by the same method as that described in Synthesis Example 3 was diluted with pure water so that the total weight became 3,890 g ($SiO_2$ concentration 1% by mass). Furthermore, an aqueous sodium hydroxide solution having a concentration of 5% by mass was added thereto so that the pH of the silica sol became 11. Subsequently, the temperature of the silica sol was increased to 80° C., and the silica sol was maintained at 80° C. for 30 minutes to prepare a core particle dispersion liquid (liquid A).

Growth of Core Particles

First, 588 g of water glass (manufactured by Dokai Chemical Industries Co., Ltd., JIS No. 3 water glass, $SiO_2$ concentration 24% by mass) was diluted with 2,232 g of water to prepare 2,820 g of an aqueous alkali silicate solution (liquid B). In addition, 2,405 g of water was added to 100.2 g of ammonium sulfate (manufactured by Mitsubishi Chemical Corporation) serving as an electrolyte to prepare 2,505.2 g of an aqueous electrolyte solution. Next, total amounts of the aqueous alkali silicate solution (liquid B) and the aqueous electrolyte solution were each added to the total amount of the core particle dispersion liquid (liquid A), the temperature of which was maintained at 80° C., over a period of one hour at 80° C. to grow particles.

Here, a ratio EA/EE of the number of equivalents of the alkali contained in the liquid B to the number of equivalents of the electrolyte was 1.0. Subsequently, aging was conducted at 80° C. for one hour, and washing was then conducted with an ultrafiltration membrane until the pH became 9.2. Subsequently, the liquid was concentrated to prepare a non-spherical silica sol having a $SiO_2$ concentration of 20% by mass. Characteristics of the prepared non-spherical silica sol are shown in Table 3. Production conditions for the non-spherical silica sol are shown in Tables 1 and 2.

Comparative Example 1

Preparation of Core Particle Dispersion Liquid

A non-spherical silica sol (average particle diameter measured by dynamic light scattering: 24 nm, minor-diameter/major-diameter ratio: 0.45, $SiO_2$ concentration: 20% by mass) prepared by the same method as that described in Synthesis Example 1 was diluted with pure water so that the total weight became 730 g ($SiO_2$ concentration 1% by mass). Furthermore, an aqueous sodium hydroxide solution having a concentration of 5% by mass was added thereto so that the pH of the silica sol became 11. Subsequently, the temperature of the silica sol was increased to 95° C., and the silica sol was maintained at 95° C. for 30 minutes to prepare a core particle dispersion liquid (liquid A).

Growth of Core Particles

First, 888 g of water glass (manufactured by Dokai Chemical Industries Co., Ltd., JIS No. 3 water glass, $SiO_2$ concentration 24% by mass) was diluted with 4,400 g of water to prepare 5,288 g of an aqueous alkali silicate solution (liquid B). In addition, 4,800 g of water was added to 151.3 g of ammonium sulfate (manufactured by Mitsubishi Chemical Corporation) serving as an electrolyte to prepare 4,951.3 g of an aqueous electrolyte solution. Next, the total amounts of the aqueous alkali silicate solution (liquid B) and the aqueous electrolyte solution were each added to the total amount of the core particle dispersion liquid (liquid A), the temperature of which was maintained at 95° C., over a period of nine hours at 95° C. to grow particles.

Here, a ratio EA/EE of the number of equivalents of the alkali contained in the liquid B to the number of equivalents of the electrolyte was 1.0. Subsequently, aging was conducted at 95° C. for one hour, and washing was then conducted with an ultrafiltration membrane until the pH became 9.8. Subsequently, the liquid was concentrated to prepare a non-spherical silica sol having a $SiO_2$ concentration of 20% by mass. Characteristics of the prepared non-spherical silica sol are shown in Table 3. In Comparative Example 1, the specific surface area of the silica sol was measured by a nitrogen adsorption method.

Comparative Example 2

Pure water was added to a silica sol (manufactured by Catalysts & Chemicals Industries Co., Ltd., Cataloid SI-40, average particle diameter measured by image analysis method: 21.2 nm, $SiO_2$ concentration: 40.7% by mass) so that the $SiO_2$ concentration became 20% by weight.

Example 6

First, 593.1 g of ethanol (water charged in advance) was heated to 65° C., and a tetraethoxysilane solution prepared by mixing 1,188 g of tetraethoxysilane (Ethyl silicate 28 manufactured by Tama Chemicals Co., Ltd., $SiO_{2=28.8}$% by weight) and 2,255 g of ethanol, and an ammonia diluted solution prepared by mixing 237.3 g of ultrapure water and 40.5 g of a 29.1% aqueous ammonia solution were continuously added thereto over a period of six hours at the same time. After the completion of the addition, the resulting liquid was maintained at this temperature for three hours to perform aging. Subsequently, the liquid was concentrated with an ultrafiltration membrane until the solid content concentration became 15% by weight to remove unreacted tetraethoxysilane. Furthermore, ethanol and ammonia were substantially completely removed by a rotary evaporator to prepare a non-spherical silica sol having a solid content concentration of 12.6% by weight. The prepared non-spherical silica sol had physical properties shown in Table 3.

With regard to the prepared non-spherical silica sol, the sodium content contained in non-spherical silica fine particles was measured in accordance with the above-described "[11] Method for quantitatively determining sodium". The sodium content was less than 1 mass ppm.

Furthermore, with regard to the prepared non-spherical silica sol, polishing properties were evaluated by the method for evaluating a polishing property for thermally oxidized film described in [10] above. The results are shown in Table 3.

Example 7

First, 593.1 g of ethanol (water charged in advance) was heated to 75° C., and a tetraethoxysilane solution prepared by mixing 1,188 g of tetraethoxysilane (Ethyl silicate 28 manufactured by Tama Chemicals Co., Ltd., $SiO_2$=28.8% by weight) and 2,255 g of ethanol, and an ammonia diluted solution prepared by mixing 336.6 g of ultrapure water and 40.5 g of a 29.1% aqueous ammonia solution were continuously added thereto over a period of six hours at the same time. After the completion of the addition, the resulting liquid was maintained at this temperature for three hours to perform aging. Subsequently, the liquid was concentrated with an ultrafiltration membrane until the solid content concentration became 15% by weight to remove unreacted tetraethoxysilane. Furthermore, ethanol and ammonia were substantially completely removed by a rotary evaporator to prepare a non-spherical silica sol having a solid content concentration of 12.6% by weight. The prepared non-spherical silica sol had physical properties shown in Table 3.

With regard to the prepared non-spherical silica sol, the sodium content contained in non-spherical silica fine particles was measured in accordance with the above-described "[11] Method for quantitatively determining sodium". The sodium content was less than 1 mass ppm.

Furthermore, with regard to the prepared non-spherical silica sol, polishing properties were evaluated by the method for evaluating a polishing property for a thermally oxidized film described in [10] above. The results are shown in Table 3.

Example 8

First, 2,372.4 g of ethanol (water charged in advance) was heated to 75° C., and a tetraethoxysilane solution prepared by mixing 1,188 g of tetraethoxysilane (Ethyl silicate 28 manufactured by Tama Chemicals Co., Ltd., $SiO_{2=28.8}$% by weight) and 2,255 g of ethanol, and an ammonia diluted solution prepared by mixing 336.6 g of ultrapure water and 40.5 g of a 29.1% aqueous ammonia solution were continuously added thereto over a period of six hours at the same time. After the completion of the addition, the resulting liquid was maintained at this temperature for three hours to perform aging. Subsequently, the liquid was concentrated with an ultrafiltration membrane until the solid content concentration became 15% by weight to remove unreacted tetraethoxysilane. Furthermore, ethanol and ammonia were substantially completely removed by a rotary evaporator to prepare a non-spherical silica sol having a solid content concentration of 12.6% by weight. The prepared non-spherical silica sol had physical properties shown in Table 3.

With regard to the prepared non-spherical silica sol, the sodium content contained in non-spherical silica fine particles was measured in accordance with the above-described "[11] Method for quantitatively determining sodium". The sodium content was less than 1 mass ppm.

Furthermore, with regard to the prepared non-spherical silica sol, polishing properties were evaluated by the method for evaluating a polishing property for a thermally oxidized film described in [10] above. The results are shown in Table 3.

Comparative Example 3

First, 2,982.5 g of a tetraethoxysilane solution prepared by dissolving 532.5 g of tetraethoxysilane (Ethyl silicate 28: manufactured by Tama Chemicals Co., Ltd, $SiO_{2=28.8}$% by mass) in 2,450 g of a water-methanol mixed solvent [weight ratio of water to methanol=2:8] and 596.4 g of an aqueous ammonia solution having a concentration of 0.25% by mass were added to a water-methanol mixed solvent (containing 139.1 g of pure water and 169.9 g of methanol) maintained at 60° C. at the same time over a period of 20 hours. A ratio ammonia/tetraethoxysilane was 0.034 (molar ratio). After the completion of the addition, the resulting liquid was further aged at 65° C. for three hours.

Subsequently, unreacted tetraethoxysilane, methanol, and ammonia were substantially completely removed with an ultrafiltration membrane. The liquid was purified with an amphoteric ion-exchange resin, and was then concentrated with an ultrafiltration membrane to prepare a silica sol having a solid content concentration of 20% by mass. The measurement results of this silica sol are shown in Table 1.

With regard to the prepared spherical silica sol, the sodium content contained in spherical silica fine particles was measured in accordance with the above-described "[11] Method for quantitatively determining sodium". The sodium content was less than 1 mass ppm.

Furthermore, with regard to the prepared silica sol, polishing properties were evaluated by the method for evaluating a polishing property for a thermally oxidized film described in [10] above. The results are shown in Table 3.

TABLE 1

| | Core particle dispersion liquid (Liquid A) | | | | | | | | | | | |
|---|---|---|---|---|---|---|---|---|---|---|---|---|
| | Type of solvent | Average particle diameter measured by dynamic light scattering nm | Minor-diameter/Major-diameter | Specific surface area measured by nitrogen adsorption method $m^2/g$ | Number of local maximum values of X-Y curve number | Silica solid content concentration mass % | Amount of core particle dispersion liquid used g | Mass of silica g | pH adjusting agent | Mass of core particle dispersion liquid after dilution with water g | Silica concentration after dilution (=silica concentration of liquid A) mass % | pH |
| | — | 12 nm | — | — | — | — | g | g | — | g | — | — |
| Example 1 | Water | 6 | 24 | 0.45 | 220 | 0.20 | 40.7 | 102.4 | 41.7 | 5% sodium hydroxide | 4,170 | 1.0 | 11 |
| Example 2 | Water | 35 | 12 | 0.15 | 455 | 0.10 | 40.7 | 102.4 | 41.7 | 5% sodium hydroxide | 4,170 | 1.0 | 11 |
| Example 3 | Water | 50 | 70 | 0.4 | 180 | 0.10 | 40.7 | 102.4 | 41.7 | 5% sodium hydroxide | 4,170 | 1.0 | 11 |
| Example 4 | Water | 50 | 100 | 0.3 | 50 | 0.10 | 30.7 | 126.7 | 38.9 | 5% sodium hydroxide | 3,890 | 1.0 | 11 |
| Example 5 | Water | 12 | 100 | 0.3 | 50 | 0.10 | 30.7 | 126.7 | 38.9 | 5% sodium hydroxide | 3,890 | 1.0 | 11 |
| Comparative Example 1 | Water | — | 24 | 0.45 | 220 | 0.20 | 48.4 | 15.1 | 7.3 | 5% sodium hydroxide | 730 | 1.0 | 11 |
| Comparative Example 2 | Water | — | — | — | — | — | — | — | — | — | — | — | — |
| Example 6 | — | — | — | — | — | — | — | — | — | — | — | — | — |
| Example 7 | — | — | — | — | — | — | — | — | — | — | — | — | — |
| Example 8 | — | — | — | — | — | — | — | — | — | — | — | — | — |
| Comparative Example 3 | — | — | — | — | — | — | — | — | — | — | — | — | — |

TABLE 2

| | Water glass | | | Silica mass in water glass g | Dilution water added to water glass g | Liquid B | | | | Dilution water added to electrolyte g | Aqueous electrolyte solution | |
|---|---|---|---|---|---|---|---|---|---|---|---|---|
| | Type | Silica concentration mass % | Amount used g | | | Mass g | Silica concentration mass % | Electrolyte Type | Amount used g | | Mass g | Concentration mass % |
| Example 1 | No. 3 water glass | 24 | 575 | 138 | 2,185 | 2,760 | 5 | Ammonium sulfate | 98.0 | 2,352 | 2,450.0 | 4.0 |
| Example 2 | No. 3 water glass | 24 | 575 | 138 | 2,185 | 2,760 | 5 | Ammonium sulfate | 98.0 | 2,352 | 2,450.0 | 4.0 |
| Example 3 | No. 3 water glass | 24 | 575 | 138 | 2,185 | 2,760 | 5 | Ammonium nitrate | 74.2 | 2,376 | 2,450.2 | 3.0 |
| Example 4 | No. 3 water glass | 24 | 588 | 141 | 2,232 | 2,820 | 5 | Ammonium nitrate | 93.3 | 2,412 | 2,505.3 | 3.7 |
| Example 5 | No. 3 water glass | 24 | 588 | 141 | 2,232 | 2,820 | 5 | Ammonium sulfate | 100.2 | 2,405 | 2,505.2 | 4.0 |
| Comparative Example 1 | No.3 water glass | 24 | 888 | 213 | 4,400 | 5,288 | 4 | Ammonium sulfate | 151.3 | 4,800 | 4,951.3 | 3.1 |
| Comparative Example 2 | — | — | — | — | — | — | — | — | — | — | — | — |
| Example 6 | — | — | — | — | — | — | — | — | — | — | — | — |
| Example 7 | — | — | — | — | — | — | — | — | — | — | — | — |
| Example 8 | — | — | — | — | — | — | — | — | — | — | — | — |
| Comparative Example 3 | — | — | — | — | — | — | — | — | — | — | — | — |

| | Equivalent ratio of alkali in liquid B/electrolyte Equivalent ratio [number of equivalents of alkali in alkali silicate/ number of equivalents of electrolyte] EA/EE | Silica parts by weight in aqueous alkali silicate solution in liquid B relative to 100 parts by weight of silica in liquid A | Particle growth | | Aging | |
|---|---|---|---|---|---|---|
| | | | Addition temperature °C. | Addition time Hrs. | Temperature °C. | Time Hrs. |
| Example 1 | 1.0 | 331 | 80 | 1 | 80 | 1 |
| Example 2 | 1.0 | 331 | 65 | 1 | 65 | 1 |
| Example 3 | 0.8 | 331 | 95 | 1 | 95 | 1 |
| Example 4 | 0.65 | 362 | 80 | 1 | 80 | 1 |
| Example 5 | 1.0 | 362 | 80 | 1 | 80 | 1 |
| Comparative Example 1 | 1.0 | 2,918 | 95 | 9 | 95 | 1 |
| Comparative Example 2 | — | — | — | — | — | — |
| Example 6 | — | — | — | — | — | — |
| Example 7 | — | — | — | — | — | — |
| Example 8 | — | — | — | — | — | — |
| Comparative Example 3 | — | — | — | — | — | — |

TABLE 3

| | Non-spherical silica sol | | | | | | | | | | |
|---|---|---|---|---|---|---|---|---|---|---|---|
| | pH | Average particle diameter measured by dynamic light scattering nm | BET specific surface area m²/g | Average of major axis (image analysis method) nm | Minor-diameter/ Major-diameter ratio | Number of local maximum values of X-Y curve number | Average of distance Y (Ya) nm | Standard deviation of distance Y (σ) | Coefficient of variation of distance Y % | Content of non-spherical silica fine particles % | Polishing properties | |
| | | | | | | | | | | | Polishing rage nm/min | Scratches number |
| Example 1 | 9.1 | 37 | 195 | 31 | 0.45 | 3.1 | 7.0 | 1.19 | 17.1 | 100 | 43 | 20 |
| Example 2 | 9.4 | 22 | 380 | 53 | 0.15 | 4.2 | 4.0 | 0.52 | 13.0 | 100 | 21 | 15 |
| Example 3 | 10.0 | 117 | 84 | 80 | 0.6 | 4.5 | 18.5 | 3.15 | 17.0 | 100 | 63 | 20 |
| Example 4 | 9.8 | 185 | 49 | 150 | 0.3 | 5.3 | 22.5 | 4.13 | 19.0 | 100 | 85 | 6 |
| Example 5 | 9.2 | 184 | 49 | 145 | 0.3 | 4.5 | 21.8 | 3.72 | 17.1 | 100 | 82 | 8 |
| Comparative Example 1 | 9.8 | 88 | 91 | 76 | 0.45 | 0.5 | 17.1 | 1.20 | 7.0 | 100 | 18 | 30 |
| Comparative Example 2 | 9.0 | 27 | 130 | 22 | 0.95 | — | — | — | — | 0 | 25 | 20 |
| Example 6 | — | 41 | 325 | 41 | 0.53 | 4.7 | 17.1 | 3.83 | 23.0 | 100 | 140 | 5 |
| Example 7 | — | 71 | 258 | 48 | 0.6 | 3.3 | 24.2 | 3.48 | 15.0 | 93 | 178 | 3 |
| Example 8 | — | 40 | 149 | 39 | 0.66 | 2.7 | 24.5 | 1.17 | 26.0 | 85 | 120 | 6 |
| Comparative Example 3 | — | 24 | 198 | 25 | 0.9 | — | — | — | — | — | 87 | 8 |

The non-spherical silica fine sol of the present invention has a highly practical use as a polishing material. Furthermore, since the non-spherical silica sol has good physical properties such as a filling property, an oil-absorbing property, and an electrical property, and optical properties, the non-spherical silica sol is expected to be used in an additive for coatings, an additive for resins, a component of an ink-absorbing layer, a component for cosmetic preparations, and the like.

The invention claimed is:

1. A non-spherical silica sol characterized by comprising non-spherical silica fine particles dispersed in a dispersion medium, the non-spherical silica fine particles having an average particle diameter in a range of 3 to 200 nm as measured by dynamic light scattering, a minor-diameter/major-diameter ratio in a range of 0.01 to 0.7, and a specific surface area in a range of 10 to 800 m²/g, and also having a plurality of projections on the surfaces thereof, the projections including a $[SiO_{4/2}]$ unit,
   wherein, in a plane containing a major axis of each of the non-spherical silica fine particles having projections, a coefficient of variation of a distance from an arbitrary point on an outer edge of the non-spherical silica fine particle to an intersection point B of a line passing through the point on the outer edge and orthogonal to the major axis is in a range of 5% to 50%, and
   wherein the number of the non-spherical silica fine particles having projections is 50% or more of the total number of silica fine particles serving as a dispersoid.

2. The non-spherical silica sol according to claim 1, wherein an X-Y curve of the non-spherical silica fine particles has a plurality of local maximum values, and
   wherein, in the plane containing the major axis of each of the non-silica fine particles, Y is the distance of an orthogonal line extending from the arbitrary point on the outer edge of the non-spherical silica fine particle to a point where the orthogonal line intersects the major axis; and X is the distance between a point of intersection of the outer edge of the non-silica fine particle with the major axis to the point where the orthogonal line intersects the major axis.

3. The non-spherical silica sol according to claim 1, characterized in that the non-spherical silica fine particles having projections are composed of polysiloxane including a $[SiO_{4/2}]$ unit obtained by hydrolysis of tetraethoxysilane.

4. The non-spherical silica sol according to claim 1, characterized in that the content of sodium contained in the non-spherical silica fine particles having projections is 100 mass ppm or less.

5. A polishing material comprising the non-spherical silica sol according to claim 1, wherein the non-spherical silica fine particles are present in an amount of 50% or less by weight based on the total weight of the polishing material.

6. A composition for polishing, characterized by comprising the non-spherical silica sol according to claim 1 and a solvent, wherein the non-spherical silica fine particles are dispersed in the solvent.

\* \* \* \* \*